(12) United States Patent
Hayashi et al.

(10) Patent No.: US 7,780,438 B2
(45) Date of Patent: Aug. 24, 2010

(54) SUBSTRATE HEATING APPARATUS AND METHOD AND COATING AND DEVELOPING SYSTEM

(75) Inventors: Shinichi Hayashi, Koshi (JP); Hiroaki Inadomi, Koshi (JP)

(73) Assignee: Tokyo Electron Limited, Tokyo-To (JP)

( * ) Notice: Subject to any disclaimer, the term of this patent is extended or adjusted under 35 U.S.C. 154(b) by 1080 days.

(21) Appl. No.: 11/416,094

(22) Filed: May 3, 2006

(65) Prior Publication Data
US 2006/0252000 A1 Nov. 9, 2006

(30) Foreign Application Priority Data
May 9, 2005 (JP) ............................. 2005-136645

(51) Int. Cl.
*F27D 15/02* (2006.01)
(52) U.S. Cl. ..................... 432/81; 219/390; 219/443.1; 219/444.1
(58) Field of Classification Search .............. 432/77, 432/81, 239, 247, 253; 219/443.1, 444.1, 219/390, 405, 411; 392/416, 418; 118/724, 118/729
See application file for complete search history.

(56) References Cited
U.S. PATENT DOCUMENTS

| | | | | |
|---|---|---|---|---|
| 5,414,244 A * | 5/1995 | Imahashi | ..................... | 219/497 |
| 6,276,072 B1 * | 8/2001 | Morad et al. | ................... | 34/428 |
| 6,354,832 B1 * | 3/2002 | Yoshimura et al. | .......... | 432/247 |
| 6,450,803 B2 * | 9/2002 | Shirakawa et al. | ............ | 432/77 |
| 6,450,805 B1 * | 9/2002 | Oda et al. | ................... | 432/247 |
| 6,474,986 B2 * | 11/2002 | Oda et al. | ................... | 432/247 |
| 7,274,005 B2 * | 9/2007 | Quach et al. | ............. | 219/444.1 |
| 7,425,689 B2 * | 9/2008 | Kulp | ....................... | 219/444.1 |
| 7,527,497 B2 * | 5/2009 | Matsuoka | ...................... | 432/5 |
| 2004/0163599 A1 * | 8/2004 | Hayashide et al. | .......... | 118/725 |
| 2005/0058440 A1 * | 3/2005 | Fukumoto et al. | ........... | 392/418 |
| 2006/0216665 A1 * | 9/2006 | Fukuoka et al. | ................ | 432/4 |
| 2006/0234178 A1 * | 10/2006 | Hayashi et al. | ............. | 432/198 |
| 2007/0160947 A1 * | 7/2007 | Akimoto et al. | ............... | 432/77 |

FOREIGN PATENT DOCUMENTS

| | | |
|---|---|---|
| JP | 2001-203152 | 7/2001 |
| JP | 2001-230172 | 8/2001 |
| JP | 2006303104 A * | 11/2006 |

\* cited by examiner

*Primary Examiner*—Gregory A Wilson
(74) *Attorney, Agent, or Firm*—Oblon, Spivak, McClelland, Maier & Neustadt, L.L.P.

(57) ABSTRACT

Disclosed is a substrate heating apparatus including a hot plate that heats a substrate, and a cooling plate that supports the substrate and moves between a first position (home position) and the second position above the hot plate to transfer wafers between the two positions. A heat-radiating fin structure is connected to the cooling plate to move together with the cooling plate. The fin structure is thermally connected to the cooling plate via heat pipes. A suction port is arranged so as to locate adjacent to the fin structure when the cooling plate is in the home position. The fin structure is cooled by a gas passing therethrough before flown into the suction port, whereby the cooling plate is cooled through heat transfer from the cooling plate to the fin structure through the heat pipes.

6 Claims, 21 Drawing Sheets

SUBSTRATE HEATING APPARATUS AND METHOD AND COATING AND DEVELOPING SYSTEM

BACKGROUND OF THE INVENTION

1. Field of the Invention

The present invention relates to a substrate heating apparatus including a hot plate for heating a substrate coated with a coating solution and a cooling plate for cooling the heated substrate, a coating and developing system employing the heating apparatus, and a method of heating a substrate.

2. Description of the Related Art

A known coating and developing system coats a substrate (e.g., a semiconductor wafer, or a glass substrate for a liquid crystal display) with a resist solution and develops an exposed resist, in order to form a resist pattern on the substrate. Such a coating and developing system employs a heating apparatus that is generally called "baking apparatus". For instance, the baking apparatus heats a wafer coated with a resist solution to vaporize a solvent contained in the resist solution to dry the resist solution.

FIG. 20 shows the structure of the aforementioned heating apparatus in one example. Reference numeral 10 denotes a casing, and reference numeral 10a denotes a wafer delivery port. Reference numeral 11 denotes a base plate, and reference numeral 12 denotes a cooling plate for cooling a wafer adapted to move toward a hot plate 12a. Drive mechanisms 13 and 14 are arranged in a space below the base plate 11 to vertically move pins 13a and 14a, respectively. Vertical movement of the pins 13a by the drive mechanism 13 assists the transferring of a wafer between the cooling plate 12 and a not shown wafer conveyer that enters the casing 10 through the wafer delivery port 10a. Vertical movement of the pins 14a by the drive mechanism 14 assists the transferring of the wafer between the cooling plate 12 and the hot plate 12a. Reference numeral 15 denotes a cap-shaped top plate that moves vertically by a driving mechanism 15a.

When the wafer W is placed on the hot plate 12a, the top plate 15, which serves as a gas flow guide and is arranged above the base plate 11, descends to contact closely to the base plate 11 via an O-ring 15b to define a sealed space around the wafer W, as shown in FIG. 21. Thereafter, a gas supply unit 17a supplies a gas into the sealed space through gas supply ports 17 circumferentially arrayed around the wafer W, while a suction unit 18a suctions a gas in the sealed space through a suction port 18 arranged at the central portion of the top plate 15. Thereby, the wafer W is heated while the gas flows from the peripheral portion towards the central portion of the wafer W, as indicated by arrows.

The aim of the provision of the cooling plate is to improve the throughput of the coating and developing system. In detail, after the wafer (i.e., substrate) is subjected to a heating process in the heating apparatus, the substrate is conveyed to a cooling apparatus that cools the substrate to a designated temperature with high temperature accuracy. As a substrate conveyer, which conveys substrates between apparatuses included in the coating and developing system, is operated according to a predetermined conveying schedule, the substrate having been heated by the hot plate of the heating apparatus must stand by in the heating apparatus for transfer to the cooling apparatus by the substrate conveyer, for a predetermined time period. If the substrate is cooled (pre-cooled) during this time period, the cooling process time in the cooling apparatus can be shortened. This may results in improvement of throughput of the coating and developing system, and may provide a possibility of reducing the total number of the cooling apparatuses included in the coating and developing system. The above is the reason for the provision of the cooling plate in the heating apparatus.

In former years, a cooling plate and thus the substrate plated on the cooling plate in the heating apparatus is cooled by a cooling liquid flowing through cooling liquid tubes arranged in or on the cooling plate. Such a cooling structure is associated with a risk of leakage of the cooling liquid from the cooling liquid tubes. In addition, as the cooling liquid tubes meandering through the interior of the heating apparatus bend and stretch, the freedom of layout design of the driving mechanism for moving the cooling plate is greatly limited. Moreover, the structure of the cooling plate and the relevant component parts is complicated, the number of the component parts is large, and the maintenance of the cooling mechanism is troublesome.

In order to solve the above problems and to simplify the whole structure of the heating apparatus, a heating apparatus employing heat pipes instead of the aforementioned cooling liquid tubes has been recently proposed.

JP2001-203152A discloses a heating apparatus provided with a cooling mechanism including a cooling plate and heat pipes embedded in the cooling plate. The cooling plate has a first end portion located in a cooling chamber on which a substrate to be cooled is placed, and a second end portion located outside the cooling chamber and having plural air-cooled fins on the upper and lower surfaces of the second end portion. The heat pipes extend from the first end portion to the second end portion of the cooling plate. The air-cooled fins are naturally cooled, or are cooled by an optional fan arranged above the second end portion of the cooling plate to generate air flow flowing toward the air-cooled fins. The substrate placed on the first end portion of the cooling plate is effectively cooled through heat transfer from the first end portion to the second end portion of the cooling plate via the heat pipes.

The cooling mechanism of JP2001-203152A has the following problems. The fan must be arranged near the air-cooled fins in order to achieve a high cooling efficiency. This limits the freedom of layout design of the heating apparatus. In addition, in order to achieve a higher cooling efficiency, the size of the fan and/or the number of fans must be increased, and thus a larger space is required to arrange the fan or fans, resulting in increase of the whole size of the heating apparatus. This problem becomes more significant if the substrate size is larger. Moreover, the air flow generated by the fan may possibly raise particles, contaminating the substrate and the internal atmosphere in the heating apparatus.

JP2001-230172A discloses a heating apparatus provided with a cooling mechanism including a cooling plate and a heat pipes embedded in the cooling plate. The cooling plate has a first end portion on which a substrate to be cooled is placed, and a second end portion. The heat pipes extend from the first end portion to the second end portion of the cooling plate. The cooling plate internally provided, in the second end portion thereof, with a heat exchanging device to which the proximal ends of the heat pipes are thermally connected. A cooling medium such as water is supplied to the heat exchanging device through a cooling medium supplying and discharging pipes drawn out of the cooling plate.

The cooling mechanism JP2001-230172A still has problems of the leakage of the cooling medium and of the complicated arrangement of cooling-medium pipes and the component parts involving the supply of the cooling medium, which problems are associated with the heating apparatus in the former years described above.

SUMMARY OF THE INVENTION

The present invention has been made in view of the foregoing problems, and therefore the main object of the present invention is to provide a heating apparatus including a hot plate and a cooling plate, which has a simple structure, and which can be formed in a small size. The present invention also provides a coating and developing system employing the heating apparatus, and a method of heating a substrate.

In order to achieve the above objective, the present invention provides a heating apparatus, which includes: a casing; a hot plate, arranged in the casing, adapted to heat a substrate coated with a coating solution; a cooling plate, arranged in the casing, adapted to support the substrate thereon, adapted to move a first position in the casing in which the substrate is transferred between the cooling plate and an external substrate conveyer arranged outside the casing and a second position in the casing above the hot plate in which the substrate is transferred between the cooling plate and the hot plate, and adapted to cool the substrate having been heated by the hot plate; a cooling-plate driving mechanism adapted to move the cooling plate between the first position and the second position; a substrate support member adapted to temporarily support the substrate to transfer the substrate between the hot plate and the cooling plate; a substrate-support-member drive unit adapted to move the substrate support member; a heat pipe having a first end connected to the cooling plate, and a second end; a fin structure having cooling fins thermally connected to the second end of the heat pipe, and connected to the cooling plate such that the fin structure moves together with the cooling plate; a first suction passage having a suction port opening into a space in the casing such that the suction port is located adjacent to the fin structure when the cooling plate is in the first position, whereby the cooling plate is cooled through the heat pipe when a gas in the casing is suctioned through the suction port to form a gas flow flowing through a gap between adjacent fins of the fin structure to cool the fin structure.

In one preferred embodiment, the first position of the cooling plate is horizontally removed from the second position of the cooling plate; the casing is provided therein with a partitioning plate dividing an interior of the casing into an upper space above the partitioning plate and a lower space below the partitioning plate; the cooling plate is arranged in the upper space; the cooling-plate driving mechanism and the substrate-support-member drive unit are arranged in the lower space; and the first suction passage extends through the lower space.

In one preferred embodiment, the heating apparatus further includes: a top plate arranged above the hot plate to oppose the same; and a second suction passage having a suction port adapted to suction a gas from a space between the hot plate and top plate to form a gas flow flowing along the top plate and flowing into the suction port of the second suction passage, wherein the second suction passage merges into the first suction passage.

In one preferred embodiment, the heating apparatus further includes: a top plate arranged above the hot plate to oppose the same; a second suction passage having a suction port adapted to suction a gas from a space between the hot plate and top plate to form a gas flow flowing along the top plate and flowing into the suction port of the second suction passage; a main suction passage into which the second suction passage merges; a sucking-force generating device arranged in the main suction passage adapted to generate a sucking force to suction the lower space of the casing, wherein the first suction passage is connected to the main suction passage at a position upstream of the sucking-force generating device.

The cooling plate may have cut-outs at a periphery thereof, whereby the external substrate conveyer having an arm, whose profile corresponds to that of the cut-outs, holding the substrate can vertically pass through the cooling plate to transfer the substrate to the cooling plate.

The present invention also provides a coating and developing system, which includes: a carrier block adapted to receive or deliver a substrate carrier holding substrates; a processing block including a coating apparatus adapted to apply a resist onto a substrate removed from a carrier, the aforementioned heating apparatus adapted to heat the substrate coated with the resist, and a developing apparatus adapted to develop the substrate having been exposed; and an interface block adapted to transfer the substrate between the processing block and an exposing apparatus.

The present invention also provides a substrate processing method, which includes: heating a substrate coated with a coating solution by a hot plate; transferring the substrate having been heated by the hot plate to a cooling plate, which is connected to a fin structure having cooling fins; moving the cooling plate supporting the substrate to a position remote from the hot plate to locate the fin structure connected to the cooling plate adjacent to a suction port of a first suction passage; and suctioning a gas existing around the fin structure through the suction port to generate a gas flow flowing into the suction port through a gap between adjacent fins of the fin structure, thereby cooling the cooling plate and the substrate placed thereon through heat transfer from the cooling plate to the fin structure.

In one preferred embodiment, the substrate is heated while a top plate is arranged above the substrate and a gas flow flowing along the top plate and flowing into a suction port of a second suction passage is generated, and the gas flow flowing through the first suction passage merges into the gas flow flowing through the second suction passage.

The method may be carried out by using a heating apparatus having therein an upper space and a lower space separated by a partitioning plate, the cooling plate and hot plate are is arranged in the upper space, and a cooling-plate driving mechanism for moving the cooling plate and a substrate-support-member drive unit for moving a substrate support member for assisting the transferring of the wafer between the cooling plate and the hot plate are arranged in the lower space. In this case, the method may further include: suctioning a gas existing in the lower space through a main suction passage; generating sucking force by means of a sucking-force generating device arranged in the main suction passage; merging the gas flow flowing through the first suction passage into a gas flow flowing through the main suction passage at a position upstream of a position where the sucking-force generating device is arranged; and merging the gas flow flowing through the second suction passage into the gas flow flowing through the main suction passage at a position downstream of the position where the sucking-force generating device is arranged.

DETAILED DESCRIPTION OF THE PREFERRED EMBODIMENTS

Figure 1:
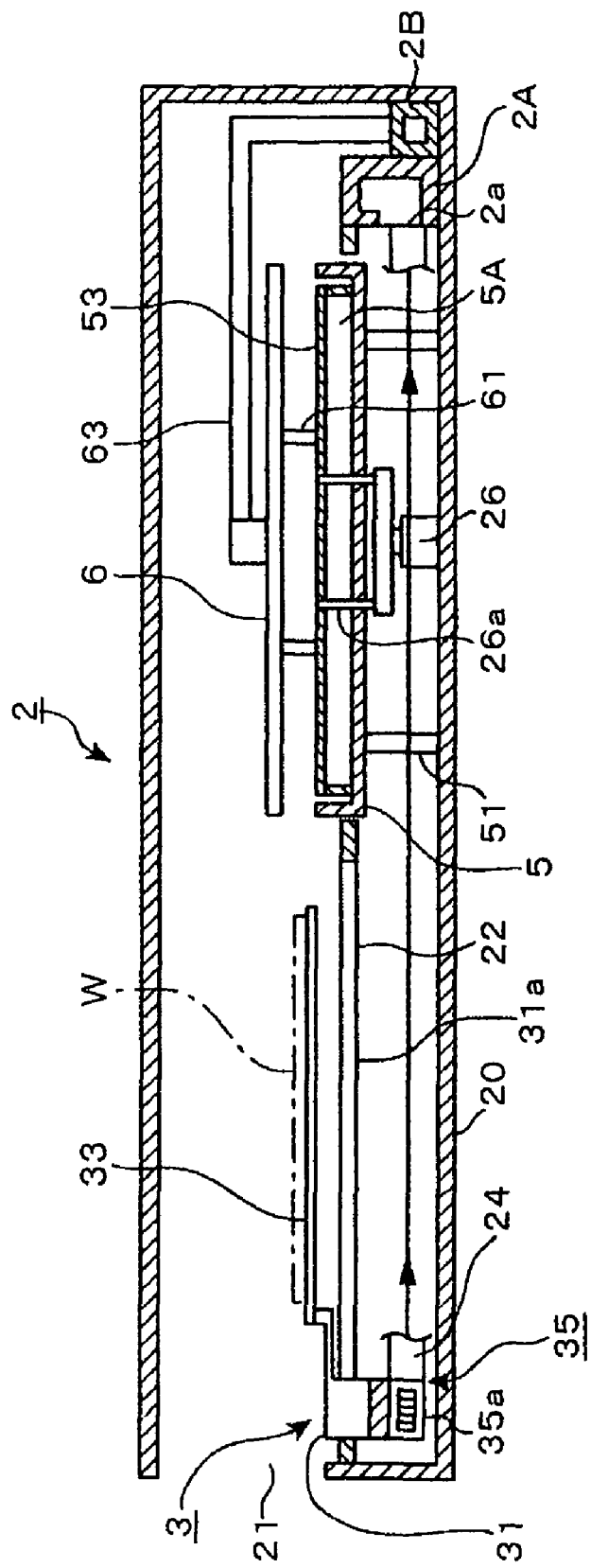
FIG. 1 is a vertical cross-sectional view of a heating apparatus in one embodiment of the present invention.
Figure 2:
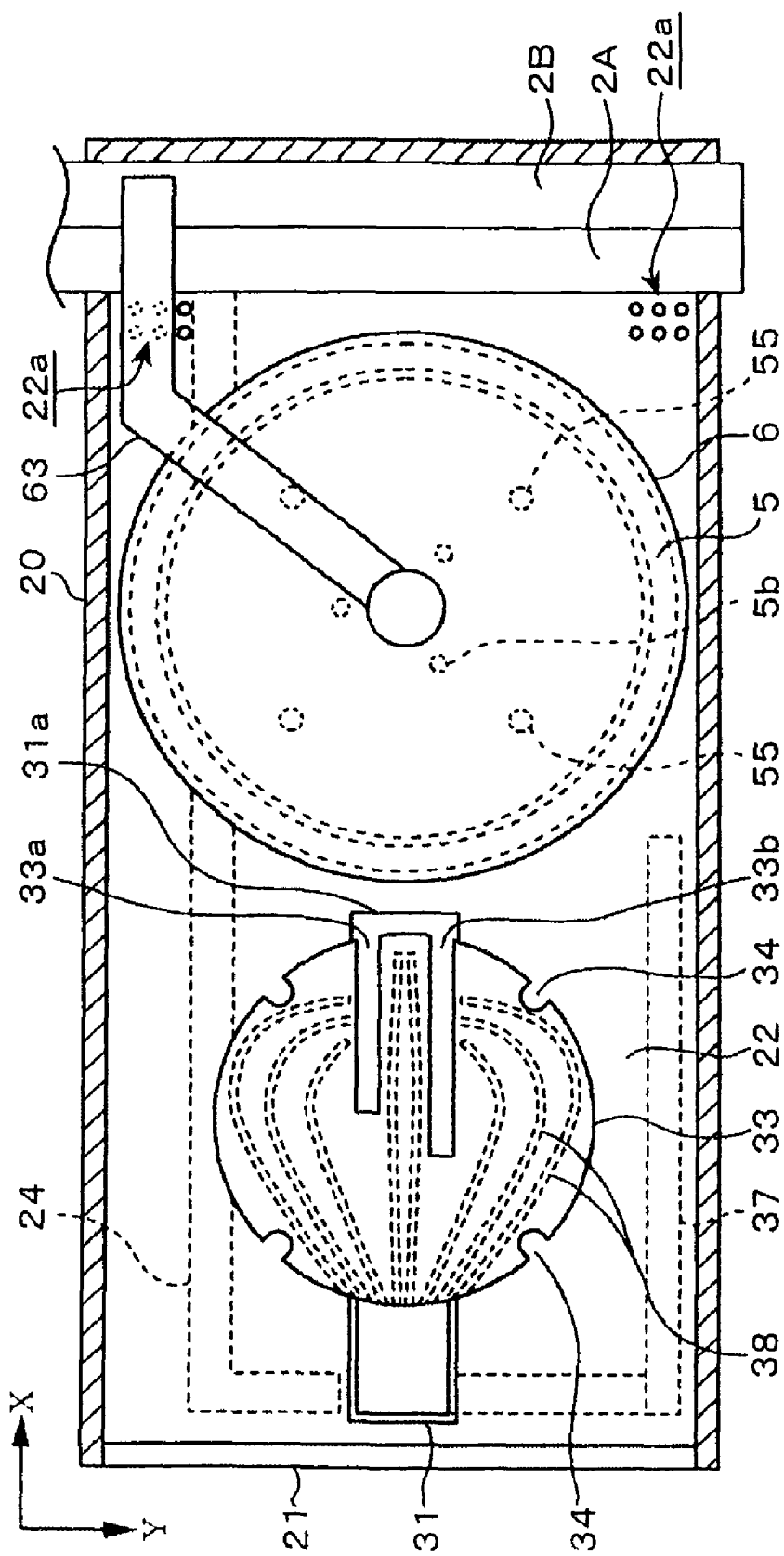
FIG. 2 is a horizontal cross-sectional view of the heating apparatus of FIG. 1.
Figure 3:
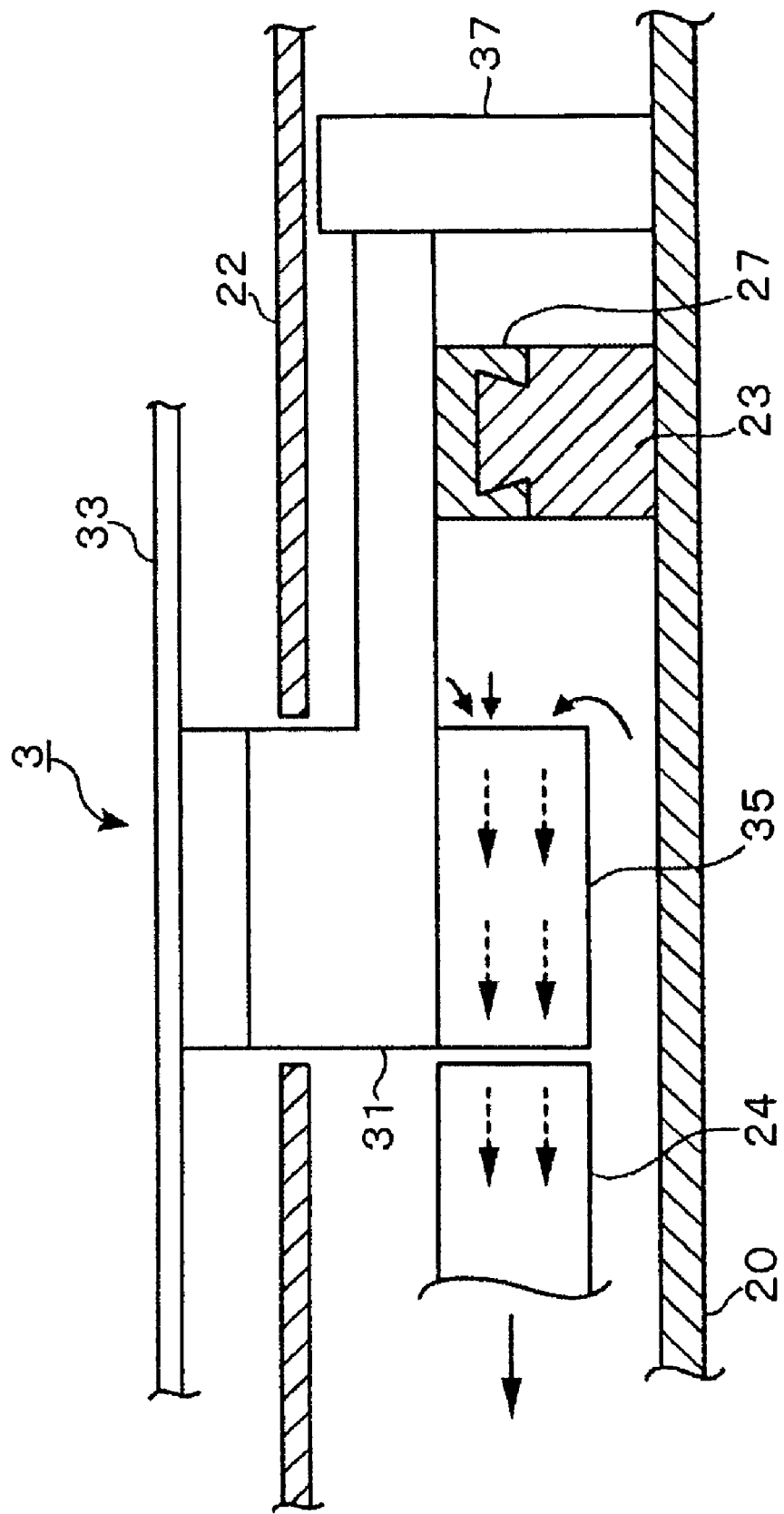
FIG. 3 is a vertical cross-sectional view of a cooling mechanism of the heating apparatus of FIG. 1.

A heating apparatus according to the present invention will be described with an illustrative embodiment in which the heating apparatus performs a baking treatment that heats a semiconductor wafer (i.e., substrate) coated with a resist solution (i.e., coating solution) to form a resist film on the wafer. Referring to FIGS. 1 and 2, the heating apparatus 2 includes a casing 20 having a front wall provided with a wafer-delivery port 21. A base plate 22, or a partitioning plate, is arranged in the casing 20 to separate the interior of the casing 20 into an upper space (wafer-moving space) and a lower space. For simplicity of explanation, the wafer-delivery-port side of the casing 20 is referred to "front (side)", and the other side is referred to "back or rear (side)", herein. An opening 31a, or a slit, is formed in the base plate 22 to allow a cooling mechanism 3 (described later) to move in a front-and-back direction (X-direction in FIG. 2). A plurality of small through-holes 22a, or gas-communicating holes, are formed in the rear end portion of the base plate 22 to discharge a gas from the upper space of the casing 20 into the lower space of the same, and then into a first intermediate duct 2A (described later).

Figure 6:
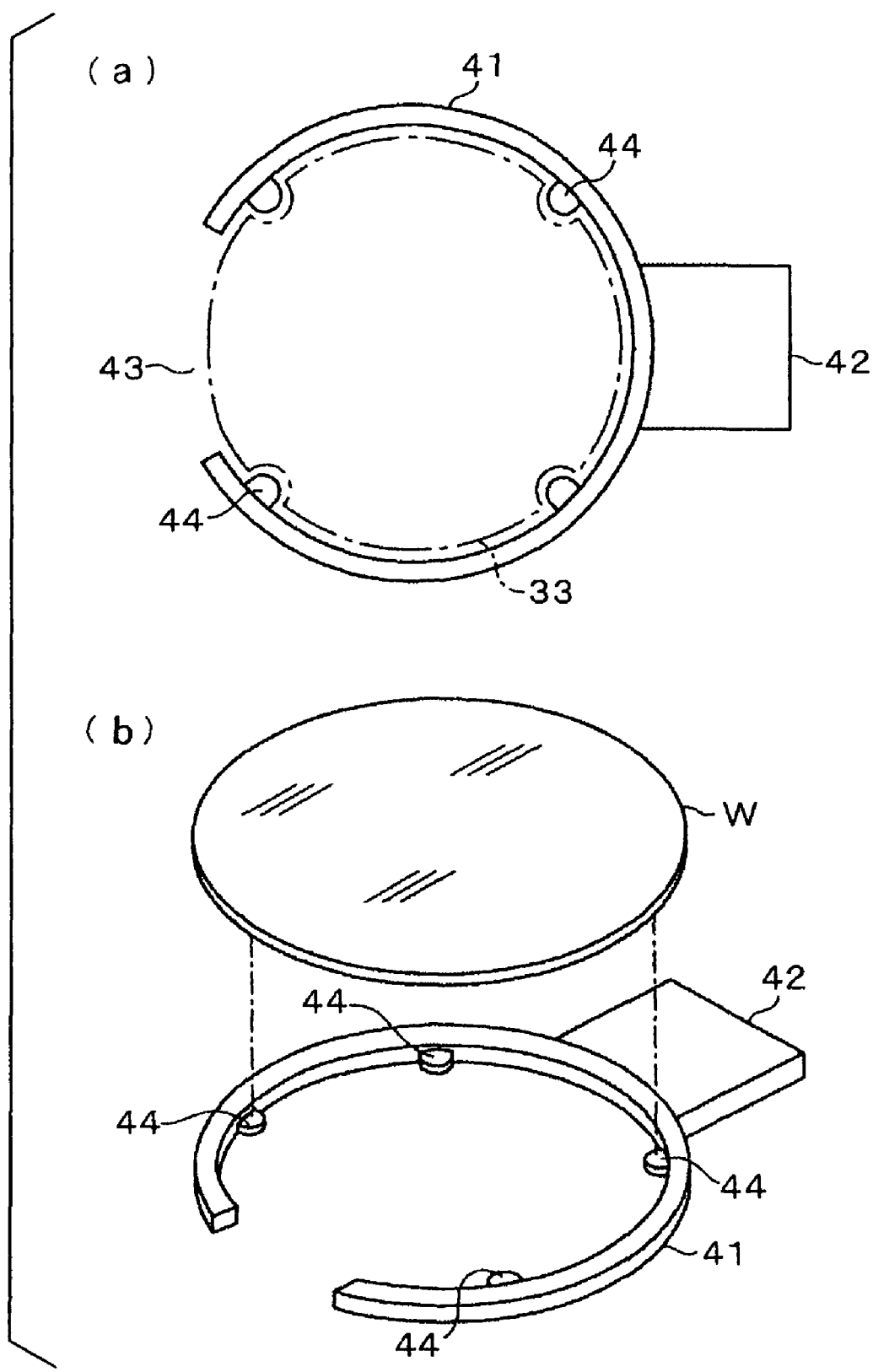
FIG. 6A is a top plan view of a wafer transfer arm of a wafer conveyer and a cooling plate of the cooling mechanism, for explanation of the transfer of the wafer between the wafer conveyer and the cooling mechanism.
FIG. 6B is a perspective view of the wafer transfer arm and a wafer.

The cooling mechanism 3 will be described with reference to FIGS. 1 to 4. The task of the cooling mechanism 3 is not only cooling a wafer W but also transferring the wafer W between a hot plate 53 and an external wafer conveyer (see FIG. 6) arranged outside the casing 20 of the heating apparatus 2. The cooling mechanism 3 is mainly composed of a connecting bracket 31, a cooling plate 33 and a heat-radiating fin structure 35. The connecting bracket 31 is made of a heat-conductive material such as copper or aluminum. The connecting bracket 31 extends through the opening 31a. A rail catch 27 is connected to the bottom of the connecting bracket 31. The connecting bracket 31 is engaged with a guide rail 23, extending in X-direction in FIG. 2, via the rail catch 27, so that the connecting bracket 31 is capable of moving along the guide rail 23. The proximal end of the connecting bracket 31 is connected to a driving mechanism 37, which is arranged in the lower space of the casing 20 below the base plate 22, and which may be a suitable linear motion actuator, such as a ball-screw mechanism or an air cylinder actuator. Thus, the cooling mechanism 3 is capable of moving in X-direction along the guide rail 23 by means of the driving mechanism 37.

The connecting bracket 31 has, at the distal upper portion thereof, an extension part thereof extending toward the back side of the casing 20 (see FIG. 4A). The cooling plate 33 is attached to the extension part, and thus moves in the upper space of the casing 20 above the base plate 22 together with the connecting bracket 31. In a typical embodiment, the cooling plate 33 is made of aluminum and has a circular-disk shape having thickness of about 4 mm. The diameter of the cooling plate 33 is essentially the same as that of a wafer W to be placed thereon. Four cut-outs 34 are formed in the periphery of the cooling plate 33. Slits 33a and 33b extending in X-direction are also formed in the cooling plate 33 through which support pins 26a (described later) can pass. Heat pipes 38 are embedded in the cooling plate 33, and extend in a manner similar to a leaf vein. The proximal end of each of the heat pipes 38 is connected to the connecting bracket 31.

Figure 5:
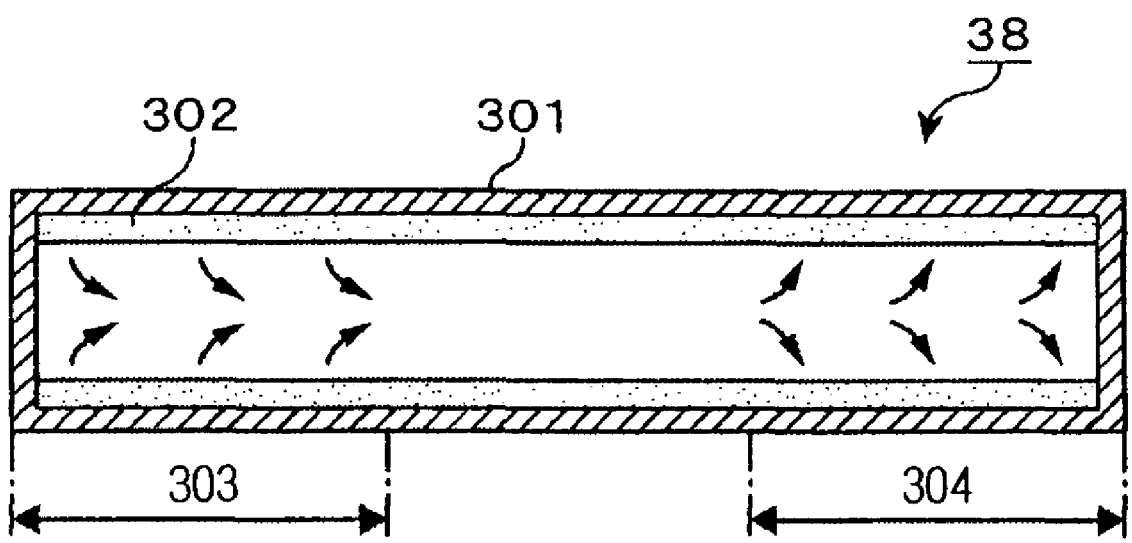
FIG. 5 is a cross-sectional view schematically showing the structure of a heat pipe of the cooling mechanism.

A heat pipe is a device for transferring heat by utilizing absorbing and releasing of latent heat of evaporation with evaporation and condensation of a working fluid. Referring to FIG. 5, the heat pipe 38 has a tubular body 301 made of aluminum, copper or a stainless steel. A porous capillary 302 is attached to the inner surface of the tubular body 301 to provide capillary action. The porous capillary 302 may be a metal mesh or a metallic felt, which may be fabricated by gathering fine metallic wires. The both end of the tubular body 301 are closed. The inner cavity of the tubular body 301 is evacuated to form a vacuum, and a small amount of a volatile liquid (i.e., working fluid) such as sodium or naphthalene is enclosed in the tubular body 301. When a hot end 303 of the heat pipe 38 is heated, the working fluid is evaporated so that the latent heat of evaporation is absorbed through the vaporization of the working fluid, and the vaporized working fluid flows (i.e., mass transfer) toward a cold end 304 of the heat pipe 38 at a high velocity under a small pressure difference between the hot end 303 and the cold end 304. When the vaporized working fluid reaches the cold end 304, it releases the latent heat of evaporation to transfer heat to the cold end 304 and to be condensed. The condensed working fluid returns to the hot end 303 through the porous capillary 302 through capillary action. A cycle consisting of evaporation, mass transfer and condensation is carried out repeatedly to continuously transfer heat from the hot end 303 to the cold end 304. Thus, the whole surface of the cooling plate 33 is cooled uniformly by the heat pipe 38, by cooling the connecting bracket 31.

The external wafer conveyer arranged outside the casing 20 for transferring a wafer to and from the cooling plate 33 will be described with reference to FIGS. 6A and 6B. The external wafer conveyer includes a wafer-carrying arm 41 having a horseshoe shape and a carrying base 42 supporting the carrying arm 41. The wafer-carrying arm 41 has an inner circumference of a diameter slightly larger than that of the cooling plate 33. Four projections 44 project inward from the inner circumference of the wafer-carrying arm 41 to support a wafer W thereon as shown in FIG. 6B. The wafer-carrying arm 41 is capable of horizontal and vertical movement by means of a not shown driving mechanism through the carrying base 42. When a wafer W is transferred from the wafer conveyer to the cooling plate 33, the wafer-carrying arm 41 holding a wafer W enters the casing 20 through the wafer-delivery port 21. The cut-outs 34 of the cooling plate 33 are arranged at angular positions corresponding to those of the projections 44 of the wafer-carrying arm 41. Thus, when the wafer-carrying arm 41 lowers from a position above the cooling plate 33 to a position below the same while the wafer-carrying arm 41 and the cooling plate 33 are aligned vertically as shown in FIG. 6A, the wafer W supported on the wafer-carrying arm 41 is transferred to the cooling plate 33. The wafer-carrying arm 41 from which the wafer is removed can be withdrawn from the casing 20 without colliding with the connecting bracket 31 due to the provision of a cut-away portion 43. Note that the external wafer conveyer and the wafer-carrying arm 41 thereof correspond to main arms A1 to A5 and carrying arms 201 and 202, respectively, which will be described later with reference to FIGS. 16 to 19.

Figure 4:
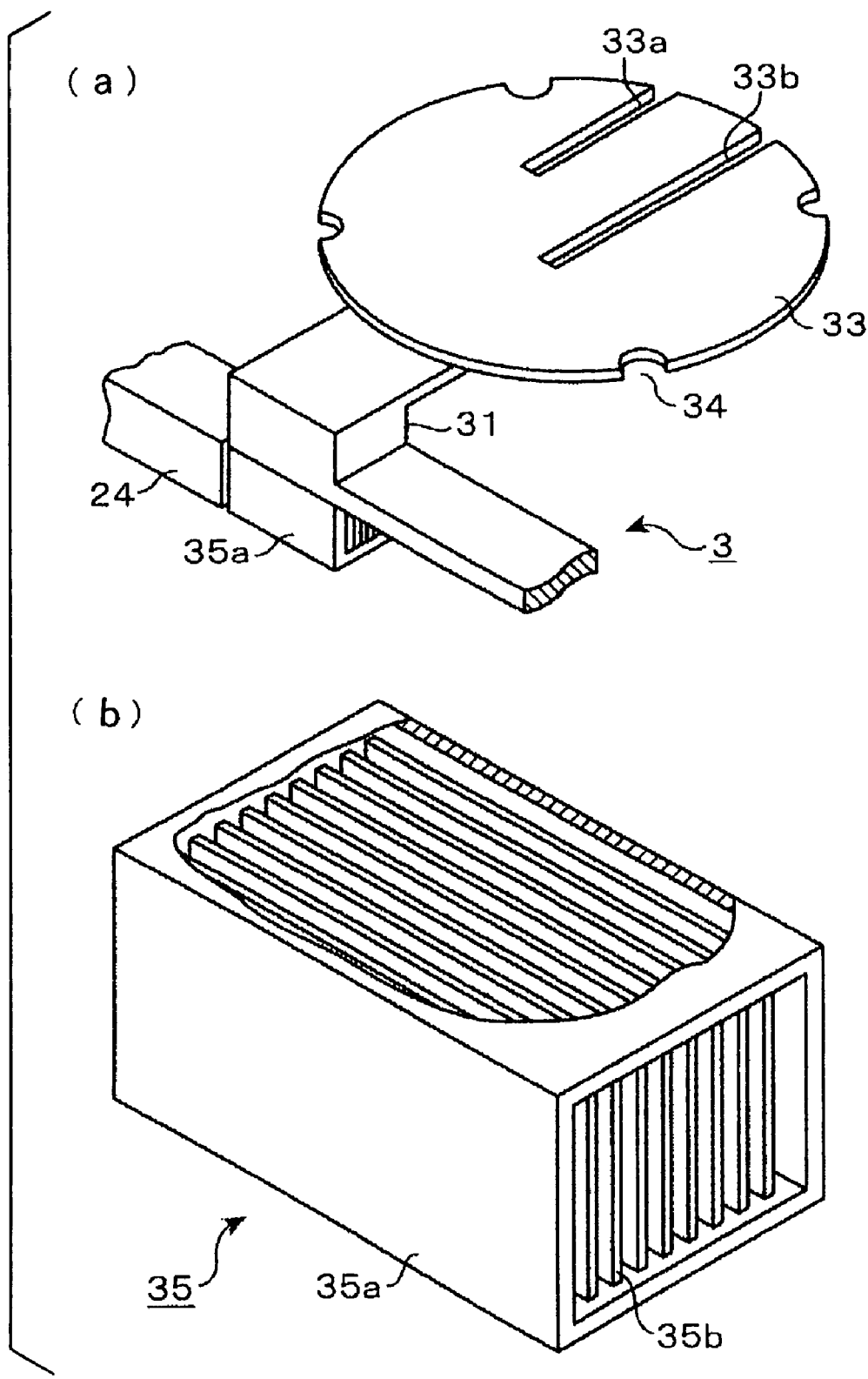
FIG. 4A is a perspective view of the cooling mechanism of FIG. 3.
FIG. 4B is a, partially-broken, perspective view of a fin structure of the cooling mechanism.

Referring back to FIGS. 1 to 4, the heat-radiating fin structure 35 is connected to the connecting bracket 31, so that the fin structure 35 moves along the guide rail 23, through the lower space of the casing 20 below the base plate 22, together with the connecting bracket 31. As best shown in FIG. 4B, the fin structure 35 has an enclosure 35a having a shape of a rectangular tube and a plurality of fins 35b arrayed in the enclosure 35a. The fin structure 35 may be made of aluminum. A local suction duct 24 (i.e., first suction passage) is arranged in the lower space of the casing 20 below the base plate 22. The local suction duct 24 has a suction port, which opens into the lower space of the casing 20 at a position adjacent to the fin structure 35 when the cooling plate 33 is located at its home position (i.e., first position) where the cooling plate 33 receives a wafer W from the wafer conveyer. The distance between the suction port and the fin structure 35 is determined so that gas flow, which is generated by suctioning a gas through the suction port of the suction duct 24 and flowing through adjacent fins 36a in the enclosure 35a, has a flow rate high enough to achieve a sufficient cooling effect of the fin structure 35.

The proximal end of the local suction duct 24 is connected to the first intermediate suction duct 2A (described later). When a gas (typically, an inert gas or clean air) in the casing 20 is suctioned by the suction port of the suction duct 24 via the first intermediate suction duct 2A, the gas flows into the suction duct of the local suction duct 24 through the fin structure 35 located adjacent to the suction port. Thus, the fins 35b of the fin structure 35 are cooled, the proximal ends of the heat pipes 38 are cooled by the connecting bracket 31, the cooling plate 33 is cooled by the heat pipes 38, and thus the wafer W placed on the cooling plate 33 is cooled. It should be noted that the gas flow rate is high at a position adjacent to the suction port, and thus the fin structure 35 can be cooled effectively. It should also be noted that the gas is not blown out from the suction port but is "suctioned" into the suction port, and thus the possibility of raising particles in the casing 20 is low.

The shape of the heat pipe 38 is not limited to a "pipe (circular tube)" shape, and may be a flattened hollow shape having a wide inner cavity containing a working fluid therein. In addition, the step (see FIG. 1) provided at the distal end portion of the connecting bracket 31 may be omitted. In this case, the circular cooling plate 33 may be provided with an extension part extending toward the front side of the casing 20, and the extension part may be attached to the upper surface of the connecting bracket 31. Further, the proximal end of each heat pipe 38 may extend through the connecting bracket 31 to the fin structure 35 to be connected to the fins 35b. That is, the proximal end of each heat pipe 38 may be cooled directly or indirectly (i.e., cooled through the connecting bracket 31) by the fin structure 35.

Figure 7:
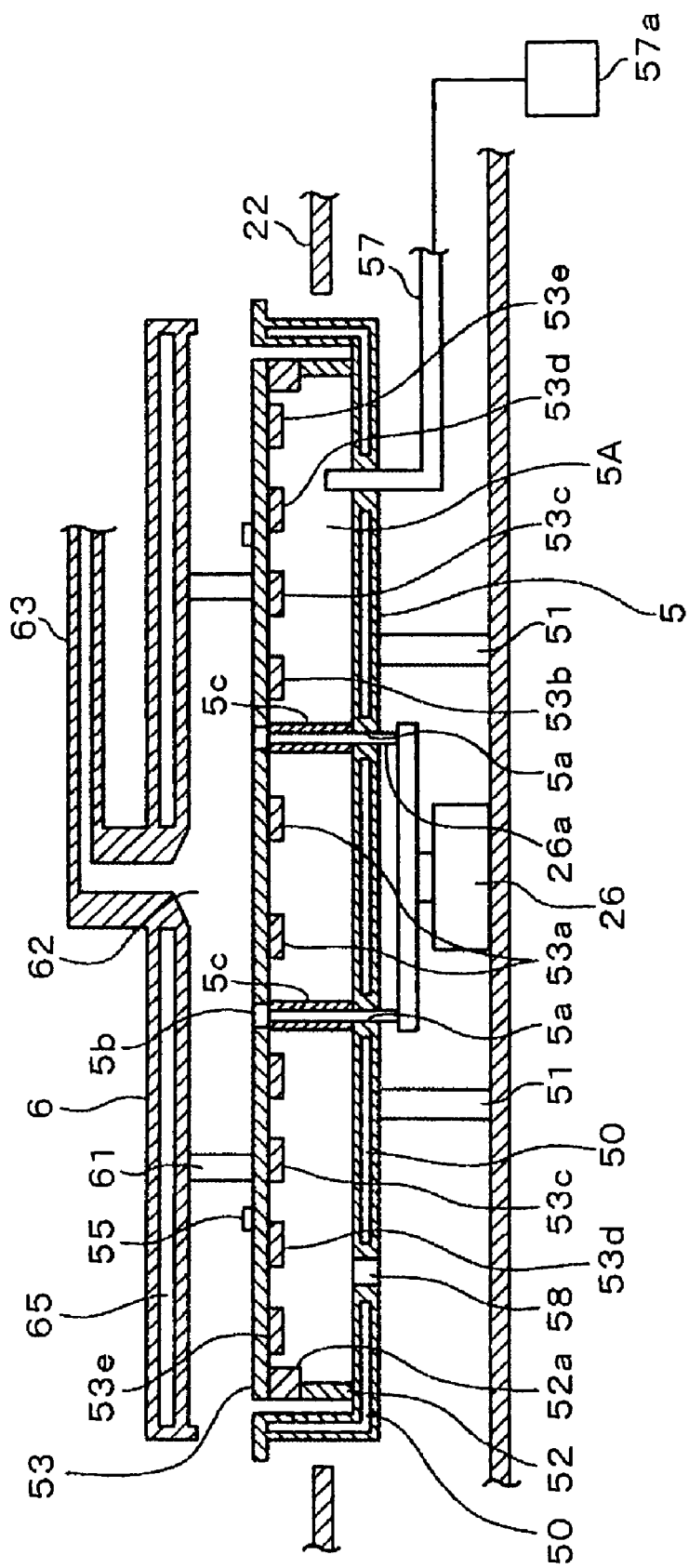
FIG. 7 is a vertical cross-sectional view showing the detailed structure of a hot plate, a top plate and relevant component parts of the heating apparatus of FIG. 1.

As shown in FIGS. 1 and 7, a circular hole is formed in the base plate 22 on the back side of the cooling mechanism 3. A hot-plate support member 5 having a shape of a flat cylinder and having heat-insulating ability is received in the circular hole, while an annular gap of about 2 mm is formed between the inner circumference of the circular hole and the outer circumference of the hot-plate support member 5. The annular gap allows a gas in the upper space of the casing 20 to be flown into the lower space of the casing 20, whereby the gas in the upper space can be discharged therefrom through the annular gap when the lower space is suctioned. As shown in FIG. 7, vacuum chambers 50 serving as vacuum insulating layers are formed in a circumferential wall and a base wall of the support member 5, to provide the same with heat-insulating ability. In detail, a circular, central vacuum chamber 50 is arranged at the center of the base wall, and ring-shaped vacuum chambers 50 are arranged radially outside the central vacuum chamber 50. The vacuum chambers 50 are radially spaced from each other, so that a gas supply pipe 57, a gas discharge hole 58, and holes 5a can pass through areas of the base wall where the vacuum chambers 50 are not formed.

Columns 51 extend upward from the bottom of the casing 20 to support the hot-plate support member 5 thereon. A support ring 52 is arranged on the base wall of the support member 5, and is positioned inwardly adjacent to the circumferential wall of the support member 5. A hot plate 53 having a circular disk shape is supported on the support ring 52 via a heat-insulating ring 52a which may be made of a heat-resistant resin material or a ceramic material. The hot plate 53 has a size (diameter) greater than that of a semiconductor wafer W, and smaller than that of the hot-plate support member 5 surrounding the hot plate 53. The arrangement of the hot plate 53 and the hot-plate support member 5 achieves reduction in heat dissipation from the hot plate 53 and thus reduction in electric power consumption.

Figure 8:
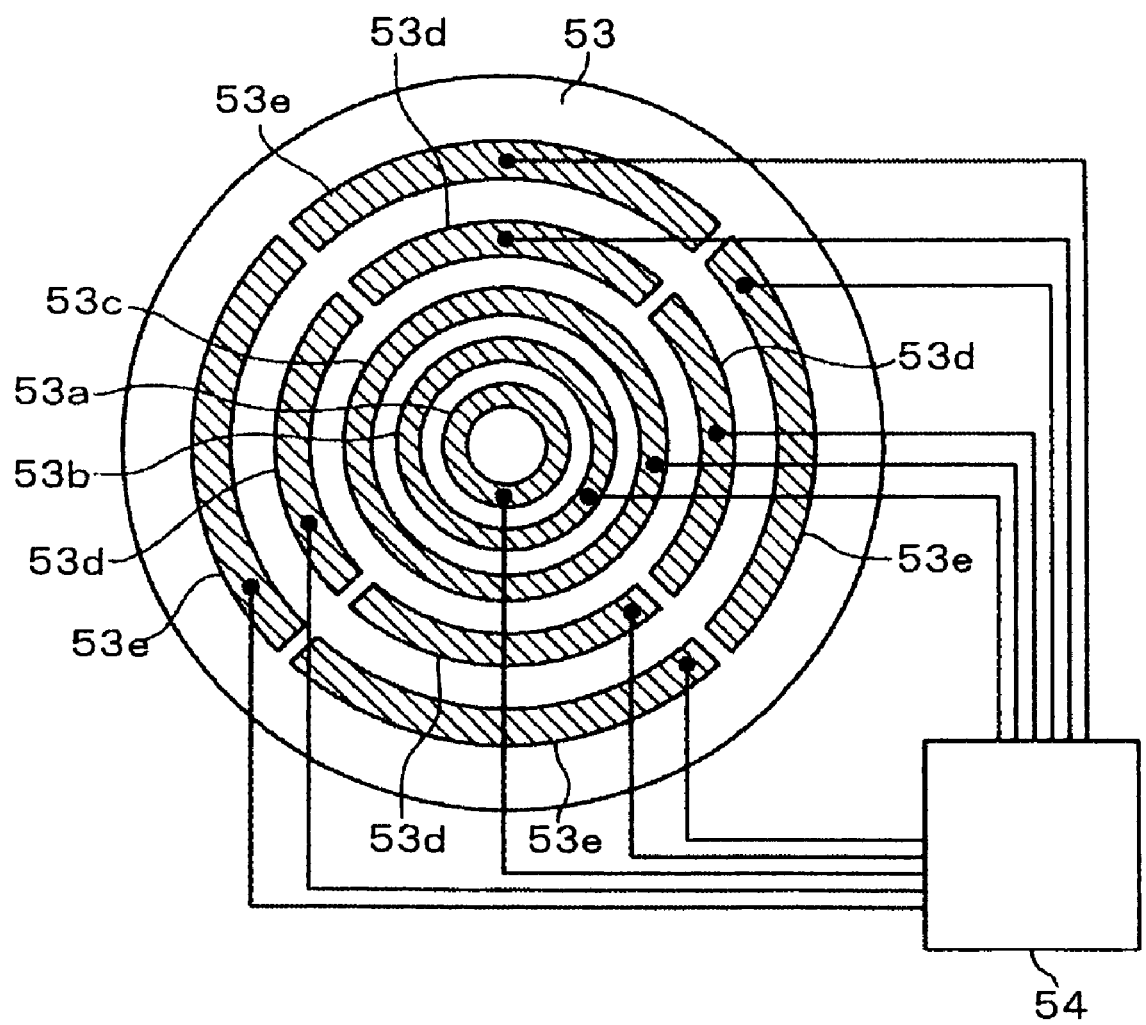
FIG. 8 is a bottom plan view of the hot plate schematically showing the arrangement of heaters.

As shown in FIG. 8, ring-shaped heaters (i.e., wafer heating means) 53a to 53e of different diameters are concentrically arranged on the lower surface of the hot plate 53. Each of the outer two heaters 53d and 53e is divided into four segments. The heaters 53a to 53e are connected to a power supply 54. A plurality of temperature sensors (not shown) are arranged at different positions on the lower surface of the hot plate 53. The calorific power of each of the heaters 53a to 53e is independently controlled by a controller (described later) based on the sensor signals received from the not shown temperature sensors. The arrangement of the heaters is not limited to that as illustrated.

As shown in FIGS. 2 and 7, a plurality of (in the illustrated embodiment, four) projections 55 are circumferentially arranged on the upper surface of the hot plate 53 to support the back surface of the wafer W thereon. Holes 5a are formed in the central portion of the hot-plate support member 5, and holes 5b are formed in the central portion of the hot-plate 53. Support pins 26a, or substrate support members, respectively pass through the holes 5a and 5b, and are connected to a drive unit 26, or a substrate-support-member drive unit, arranged right below the hot-plate support member 5. The drive unit 26 vertically moves the support pins 26a through the holes 5a and 5b, whereby the support pins 26a project from the upper surface of the hot plate 53 and retract into the hot plate 53. In FIG. 7, reference numeral 5c denotes tubular guide members which guide the support pins 26a for vertical movement.

Referring to FIG. 7, a closed space 5A (hereinafter referred to as "gas-flowing space") is bounded by the ring-shaped support member 52, heat-insulating ring 52a, hot plate 53 and the hot-plate support member 5. The distal end of each of a plurality of gas supply pipes 57 (only one of them is shown in FIG. 7) penetrates the hot-plate support member 5 to open into the gas-flowing space 5A. The proximal end of each gas supply pipe 57 is connected to a gas supply source 57a, which stores a clean purging gas, such as an inert gas (e.g., nitrogen gas), to be used for cooling the hot plate 53. A plurality of gas discharge holes 58 (only one of them is shown in FIG. 7) are formed in the hot-plate support member 5 to open into the gas-flowing space 5A. When the purging gas is supplied into the gas-flowing space 5A from the gas supply source 57a through the gas supply pipes 57, the purging gas draws heat from the hot plate 53 and is ejected through the gas discharge holes 58 from the gas-flowing space 5A, thereby the temperature of the hot plate 53 can be lowered.

As best shown in FIG. 7, four posts 61, which are spaced apart from each other, extend upward from the upper surface of the circumferential wall of the hot-plate support member 5. The upper ends of the posts 61 are connected to the peripheral portion of a circular top plate 6. The task of the top plate 6 is guiding of gas flow and heat insulation. The top plate 6 is sized such that it covers at least the whole effective area of a wafer W (i.e., an area in which semiconductor devices are formed) as viewed from above. In the illustrated embodiment, the top plate 6 is sized such that it covers the whole area of the hot plate 53. The top plate 6 is opposed to the hot plate 53. A suction port 62 opens into a space below the top plate 6 at the central portion of the lower surface of the top plate 6. The suction port 62 is inversely tapered toward the lower end thereof. The suction port 62 is connected to a suction duct 63 (i.e., second suction duct) connected to an upper portion of the top plate 6. The downstream end of the suction duct 63 is connected to a second intermediate duct 2B (described later). As will be described later, when the gas around the suction port 62 is suctioned, a gas flows into the space between the hot plate 53 and the top plate 3 from the periphery of the space, flows toward the center of the wafer W, and flows into the suction port 62.

The top plate 6 is internally provided with a vacuum chamber 63 serving as a vacuum insulating layer of the top plate 6. The vacuum chamber 63 extends radially outwardly from the suction port 62. Due to the provision of the heat-insulating vacuum chamber 63, the change in the temperature of the lower surface of the top plate 6, which is heated by thermal radiation emitted from the hot plate 53, traces the change in the temperature of the wafer W. Thus, the gas flow flowing through the space between the hot plate 53 and the top plate 6 would not be disturbed due to the temperature difference therebetween. The size of the vertical spacing between the hot plate 53 and the top plate 6 is preferably in a range of 12 to 15 mm (in a typical embodiment, 14 mm). If smaller than 12 mm, the cooling plate 33 may possibly collide with the top plate 6 or hot plate 53; if larger than 15 mm, it is possible that the lower surface of the top plate 6 can not sufficiently be heated.

Figure 9:
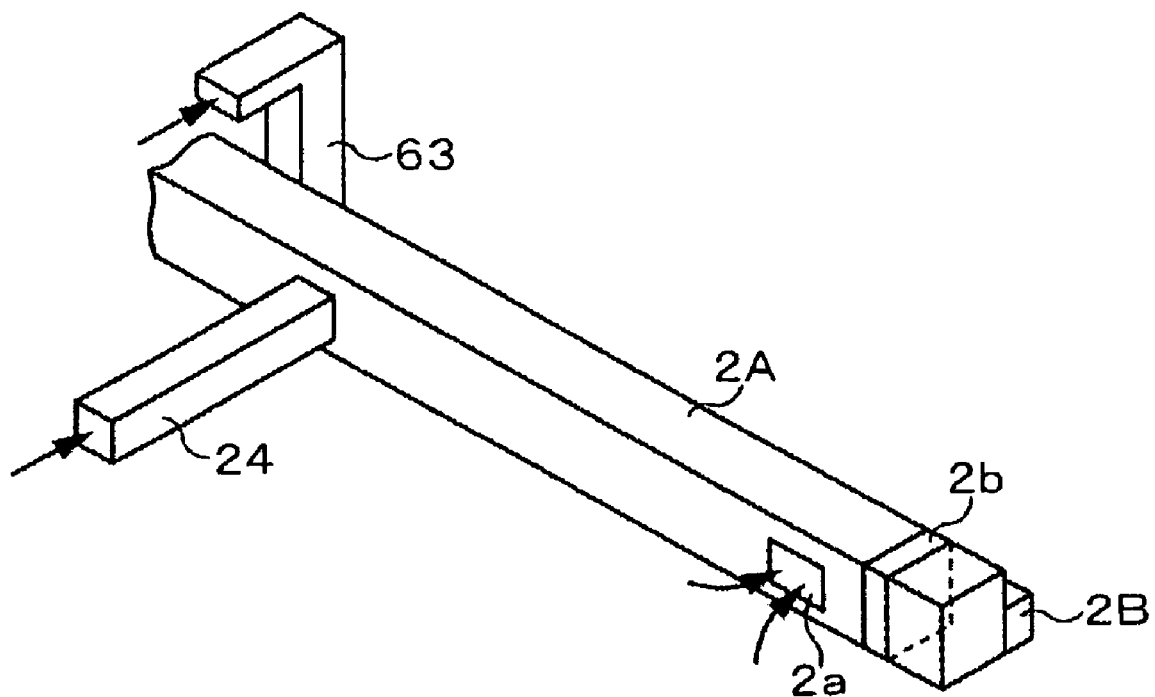
FIG. 9 is a perspective view of suction ducts of the cooling mechanism shown in FIGS. 1 and 2.

As shown in FIGS. 1 and 2, on the back side of the hot plate 53, the first intermediate suction duct 2A extends in Y-direction (see FIG. 2) through the lower space of the casing 20 below the base plate 22 to penetrate both side walls of the casing 20. Referring to FIG. 9, the first intermediate suction duct 2A is internally provided with a suctioning path extending in the longitudinal direction of the first intermediate suction duct 2A. As previously described, the local suction duct 24 is connected to the first intermediate suction duct 2A. A suction port 2a is formed in the first intermediate suction duct 2A at a position downstream of a position at which the local suction duct 24 is connected to the first intermediate suction duct 2A. A fan 2b, or a sucking-force generating device, is disposed in the first intermediate suction duct 2A at a position downstream of the suction port 2a. The second intermediate suction duct 2B is connected to the first intermediate suction duct 2A at a position downstream of the fan 2b.

The second intermediate suction duct 2B extends, parallel to the first intermediate suction duct 2A, through the lower space of the casing 20 below the base plate 22 to penetrate both side walls of the casing 20. As previously described, the local suction duct 63 is connected to the second intermediate suction duct 2B. In the illustrated embodiment, the intermediate suction ducts 2A and 2B serve as an in-apparatus, main suction passage. The downstream end of the second intermediate suction duct 2B may be connected to a factory exhaust line of a factory exhaust system. The gas existing in the casing 20 may be suctioned by sucking force of the factory exhaust system through the suction port of the local suction duct 24, suction port 2a of the first intermediate suction duct 2A, and through the suction port 62 of the top plate 6.

Figure 10:
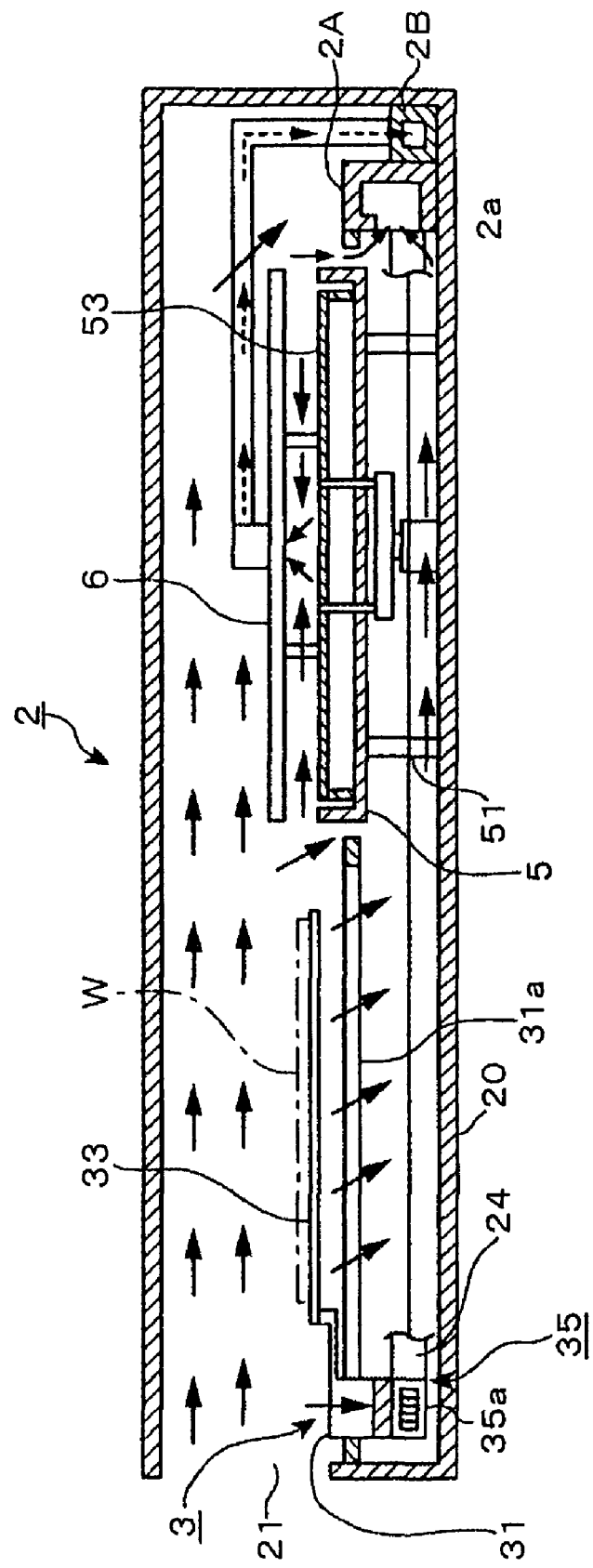
FIG. 10 is a vertical cross sectional view of the heating apparatus showing gas flow in the heating apparatus by arrows.
Figure 11:
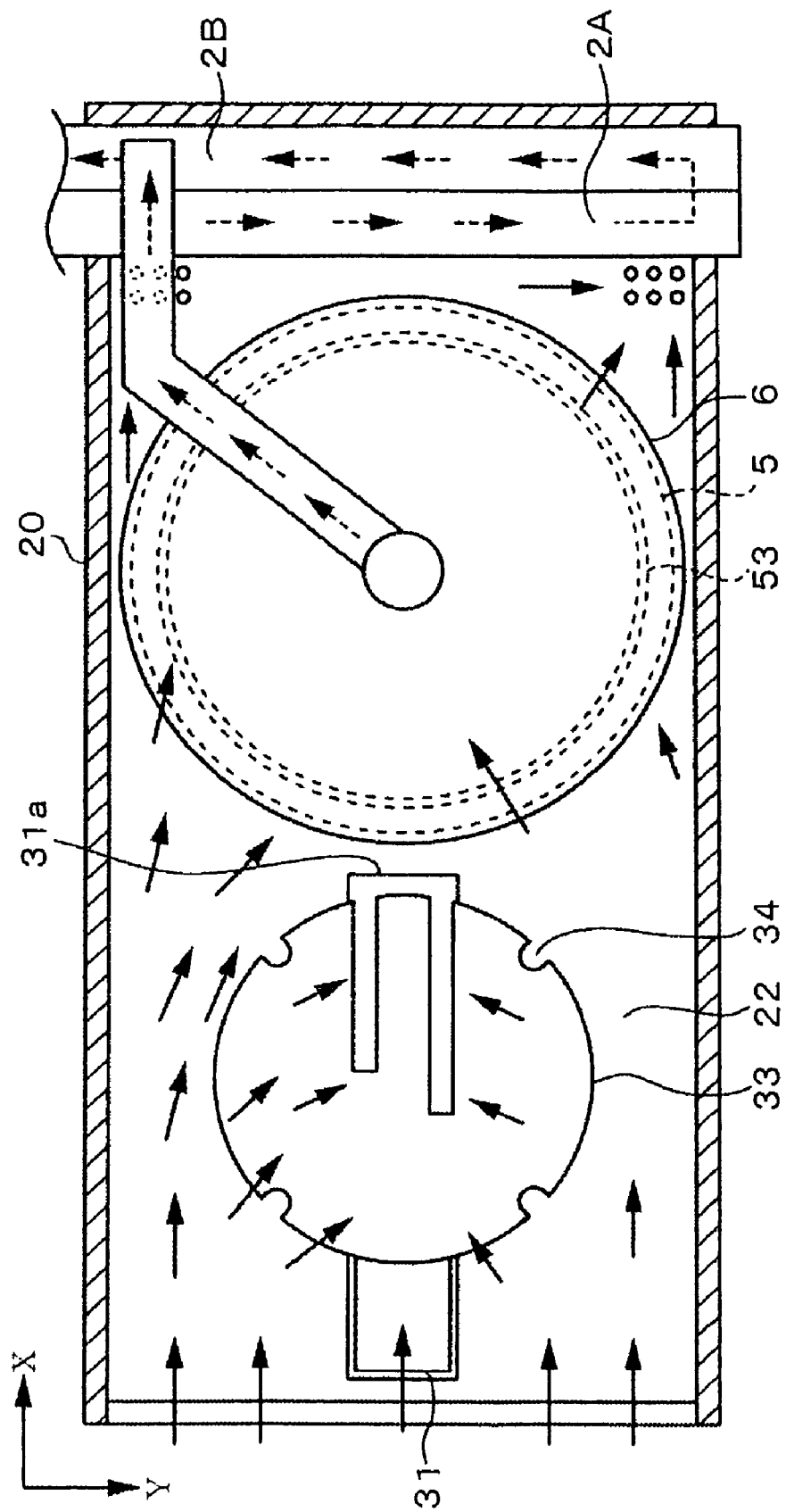
FIG. 11 is a horizontal cross sectional view of the heating apparatus showing the gas flow in the heating apparatus by arrows.

The operation of the fan 2b may be controlled by a controller (described later). By varying the rotation speed of the fan 2b, the sucking rates (i.e., flow rates), or the sucking force through the suction port of the local suction duct 24 and the suction port 2a of the first intermediate suction duct 2A can be controlled independently of the sucking rate (i.e., flow rate) through the suction port 62 of the top plate 6. In the illustrated embodiment, when heating of a wafer W is being performed, the pressure in the lower space of the casing 20 is kept lower than that in the upper space of the casing 20, and gas flow indicated by arrows in FIGS. 10 and 11 is formed in the casing 20. The gas flow is described in detail hereinafter. A gas (typically, an inert gas or clean air) comes into the casing 20 through the wafer-delivery port 21; flows through the upper space of the casing 20 above the base plate 22 toward the back side of the casing 20; and is guided, or deflected, by the top plate 6 and the hot plate 53 to flow from the periphery of the wafer W toward the center of the wafer W and is discharged through the suction port 62, or flows into the lower space of the casing 20 below the base plate 22 through the opening 31a and through-holes 22a formed in the base plate and/or through the annular gap between the outer circumference of the hot-plate support member 5 and the base plate 22. The gas flown into the lower space of the casing 20 flows into the local suction duct 24 to flow toward the first intermediate suction duct 2A; or flows through the space around the driving mechanism 37, flows through the space below the hot-plate support member 5, flows through the space around the drive unit 26 and flows into the first intermediate suction duct 2A through the suction port 2a thereof. The gas flowing through the upper space of the casing 20 entrains a solvent vapor originated from a solvent contained in a resist solution coated on the wafer W and sublimed substances originated from resist components contained in the resist solution, and flows into the lower space of the casing 20. The gas flowing through the lower space of the casing 20 entrains particles generated by the driving mechanism 37 and the drive unit 26. These gases are sucked by the suction port 2a of the first intermediate suction duct 2B, and are removed from the casing 20.

The controller of the heating apparatus 2 will be described. The controller comprises a computer having a data storage medium which stores a control program for carrying out a process recipe defining a sequence of operations of the heating apparatus 2, which includes transferring of the wafer W, heating of the wafer W, controlling of the gas flow. Upon execution of the control program by the computer, the computer controls the heating apparatus 2 according to the process recipe, so that the heating apparatus 2 carries out various operations (process steps) described below. The data storage medium for storing the control program may be a HDD (hard disk drive), which is typically fixedly installed in the computer. Alternatively, the data storage medium may be a removable media, such as a CD (compact disk), an MO (magnetooptic disk) and a memory card. In this case, the computer is provided with a reader adapted to read such a removable media.

The operations of the heating apparatus will be described. The external wafer conveyer having the carrying arm 41 (see FIGS. 6A and 6B) carries a wafer W coated with a resist solution into the casing 20 through the wafer-delivery port 21. The wafer conveyer transfers the wafer W to the cooling plate 33 in the manner previously described with reference to FIGS. 6A and 6B. The wafer conveyer moves out of the casing 20. Before the cooling plate 3 moves to the hot plate 53, the heaters 53a to 53e heat the hot plate 53, so that the upper surface of the hot plate 53 is heated up to a designated temperature such as 130° C., and the lower surface of the top plate 6 is also heated by thermal radiation emitted from the hot plate 53.

The cooling plate 33 holding the wafer W moves to a position (i.e., second position) right above the hot plate 53, and then the support pins 26a rise to support the back surface of the wafer W held by the cooling plate 33. The cooling pate 33 moves back to its home position (the left-end position in FIG. 1), and then the support pins 26a lower to place the wafer W on the projections 55 of the hot plate 53. Thus, the wafer W is heated by the hot plate 53. Preferably, the heaters arranged in the peripheral portion of the hot plate 53 generate more calorific power than that generated by the heaters arranged in the central portion of the hot plate 53, in order to achieve in-plane uniformity of the heating treatment.

When the wafer W is being heated, the solvent contained in the resist solution coated on the wafer W is vaporized, and a part of resist components contained in the resist solution sublimes. At this time, as the aforementioned gas flow is generated in the casing 20 by suctioning the gas in the casing 20, the vaporized solvent and the sublimed substances originated from the resist solution coated on the wafer W is carried by the gas flowing through the space between the top plate 6 and hot plate 53 from periphery of the wafer W toward the center of the wafer W and flowing into the suction port 62 of the top plate 6. A part of the vaporized solvent and the sublimed substances, which may possibly flow radially outward from the space between the top plate 6 and hot plate 53, is carried by the gas flowing into the through-holes 22a formed in the base plate 22 generated due to the pressure difference between the upper space and the lower space of the casing 20, and is suctioned through the suction port 2a of the first intermediate suction duct 2A. In this way, the resist solution on the wafer W is dried, so that a resist film is formed on the wafer W.

After the wafer W has been heated for a predetermined time, the support pins 26a rise to support the wafer W thereon. The cooling plate 33 moves to the position right above the hot plate 53, and the wafer W is transferred to the cooling plate 33 from the support pins 26a. Heat is transferred from the hot wafer W to the cooling plate 33, so that the temperature of the cooling plate 33 rises. When the cooling plate 33 returns to its home position, the suction port of the local suction duct 24 and the fin structure 35 of the cooling mechanism 3 are aligned with each other. Thus, the gas to be flown into the local suction duct 24 passes through the fin structure 35 to cool the same. Accordingly, the connecting bracket 31 is cooled, and the cooling plate 33 is cooled via the heat pipe 35, which is previously described with reference to FIG. 5. The not shown external wafer conveyer will pick up the wafer W from the cooling plate 33 to transfer the wafer W to another apparatus according to a predetermined conveying schedule, which will be described later. Before picking-up of the wafer by the wafer conveyer, the primary cooling of the wafer W is carried out by the cooling plate 33.

The carrying arm 41 of the wafer conveyer scoops up the wafer W from the cooling plate 33, and takes the wafer W out of the casing 20. Thereafter, the next wafer W will be carried into the casing 20 of the heating apparatus 2, and will be subjected to the heating treatment in the aforementioned manner.

The aforementioned heating apparatus 2 achieves the following advantages.

As mentioned above, the cooling plate 33 is cooled by cooling the fin structure 35, which is thermally connected to the cooling plate 33 through the connecting bracket 31 and the heat pipes 35, by suctioning a gas around the fin structure 35 into the local suction duct 24 through the fin structure 35 when the cooling plate 33 is in its home position. Thus, it is not necessary to provide cooling-liquid pipes meandering through the casing 20 to supply a cooling liquid for cooling the cooling plate, and thus the freedom of layout design of component parts of the heating apparatus 2, such as the driving mechanism 37 for moving the cooling plate 33, can be improved. In addition, due to the use of the local suction duct 24, a fan (fan 2b) generating sucking force can be disposed remote from the fin structure 35. Thus, the fan can be disposed at a suitable location such that the fan does not effect on the whole size of the heating apparatus 2 and does not limit the freedom of layout design of the component parts of the heating apparatus 2, notably, the driving mechanism 37 of the cooling plate 33. Furthermore, as the gas for cooling the fin structure 35 does not flow out of a port toward the fin structure 35 but is sucked into a port (the suction port of the local suction duct 24), there is less possibility that particles in the casing 20 are stirred up. Even if particles are stirred up, they are suctioned into the suction port of the local suction duct 24. Thus, the wafer W and the atmosphere in the casing 20 are not contaminated.

As mentioned above, the local suction duct 24 extends through the lower space of the casing 20 below the base plate 22, which the driving mechanism 37 (and the drive unit 26) having a relatively small width (as compared with a wafer) is disposed therein, and which has a room for disposing the local suction duct 24 beside the driving mechanism 37 (and the drive unit 26). Accordingly, the overall height of the casing 20 is not increased due to the provision of the local suction duct 24 in the casing 20.

As mentioned above, the proximal end of the suction duct 63 is connected to the second intermediate suction duct 2B, the proximal end of the local suction duct 24 is connected to the first intermediate suction duct 2A, and the first intermediate suction duct 2A is connected to the second intermediate suction duct 2B. Accordingly, the number of ducts drawn out of the casing 20 can be reduced.

As mentioned above, the local suction duct 24 is connected to the first intermediate suction duct 2A which suctions an atmosphere in the lower space 22 of the casing 20 below the base plate 22; the suction duct 63 connected to the top plate 6 is connected to the second intermediate suction duct 2B connected to the downstream end of the first intermediate suction duct 2A; the fan 2b (i.e., sucking-force generating device) is arranged in the first intermediate suction duct 2A; and the local suction duct 24 is connected to the first intermediate suction duct 2A at a position upstream of a position at which the fan 2b is arranged. Accordingly, the structure of the suction system composed of the suction ducts is simplified, and the fin structure 35 can be cooled effectively since a large sucking force of the local suction duct 24 can be achieved.

As mentioned above, the cooling plate 33 is provided, in the periphery thereof, with cut-outs 34 having a shape corresponding to the shape of the wafer-carrying arm 41, which allows the wafer-carrying arm 41 holding a wafer W to pass through the cooling plate 33 downwardly to transfer the wafer W to the cooling plate 33. Accordingly, it is not necessary to provide the heating apparatus 2 with means for assisting the transferring of the wafer W between the wafer-carrying arm 41 and the cooling plate 31, such as wafer support pins and an elevating mechanism to drive the support pins for vertical movement. Thus, the total number of the component parts of the heating apparatus 2 can be reduced.

In one alternative embodiment, instead of providing the local suction duct 24 in the casing 20, there may be provided a cold block provided therein with a cooling liquid passage connected to a cooling liquid supply mechanism and a cooling liquid discharge mechanism. In this case, a cooling block may be provided instead of the fin structure 35. When the cooling plate is in its home position, the cold block comes into contact with the cooling block, and the cold block thus draws heat from the cooling block, whereby the cooling plate 33 is cooled through heat transfer from the cooling plate 33 to the cooling block via the heat pipes 38.

A heating apparatus 7 in another embodiment of the present invention will be described with reference to FIGS. 12 to 14. The heating apparatus mainly differs from the foregoing embodiment (heating apparatus 2) of FIGS. 1 to 11 in the structure of means for generating gas flow in the space between the hot plate and the top plate.

Figure 12:
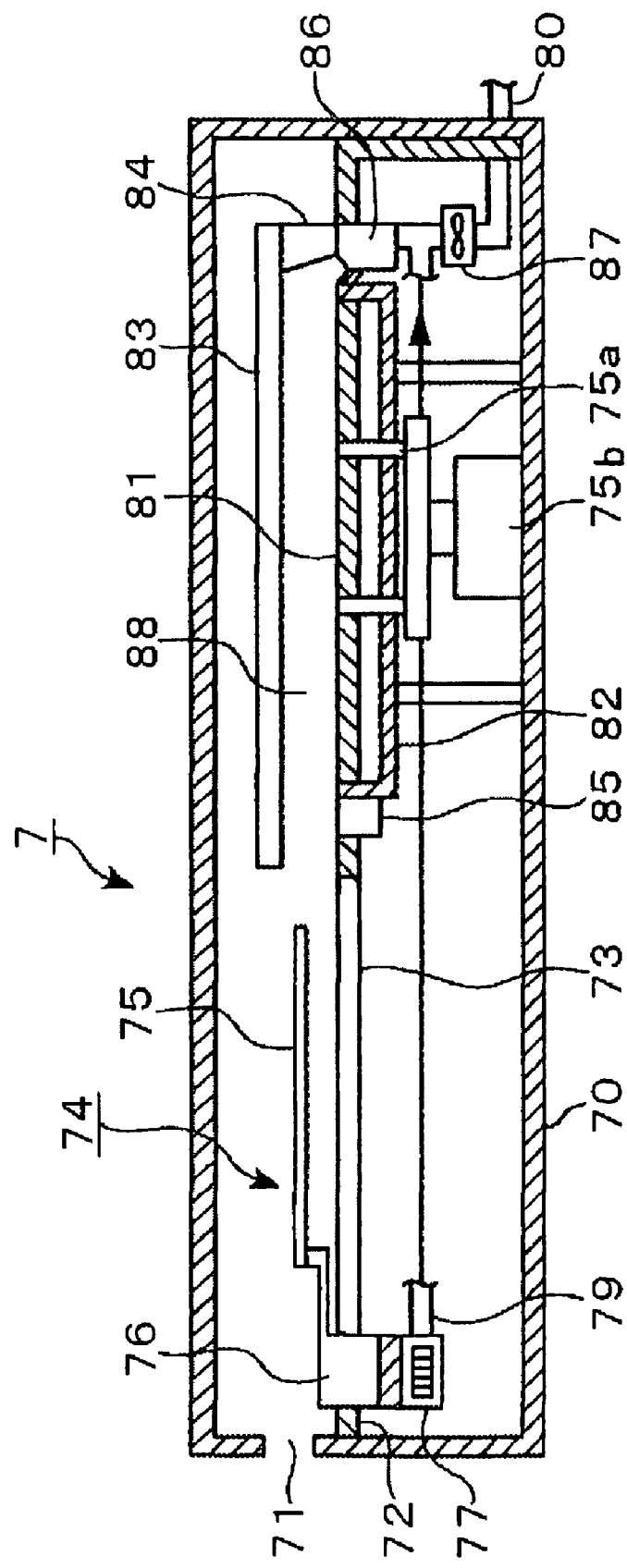
FIG. 12 is a vertical cross-sectional view of a heating apparatus in another embodiment of the present invention.
Figure 13:
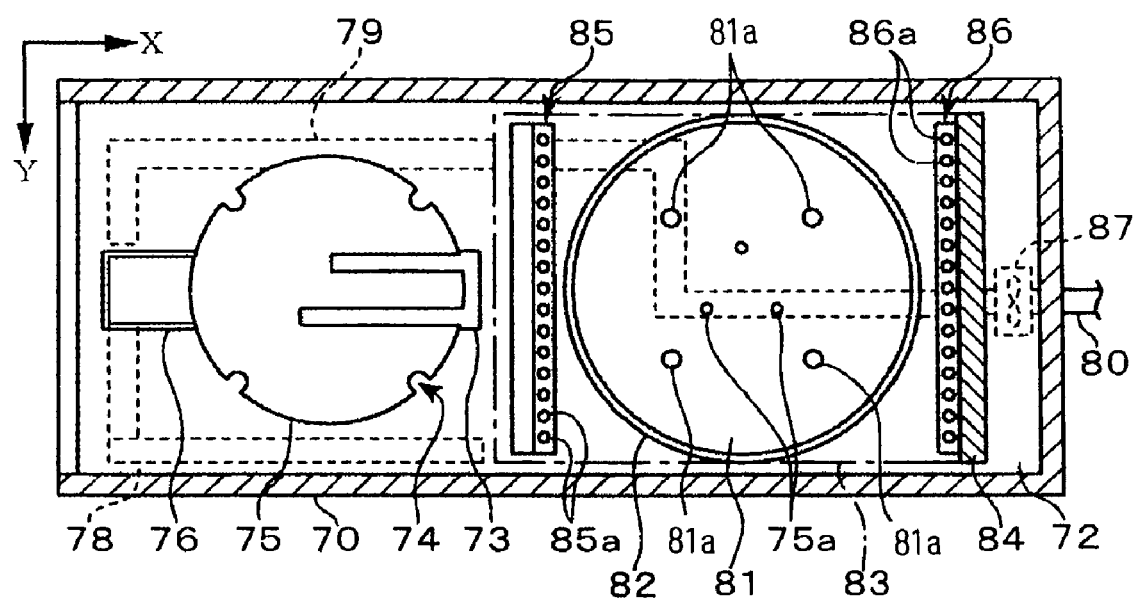
FIG. 13 is a horizontal cross-sectional view of the heating apparatus of FIG. 12.
Figure 14:
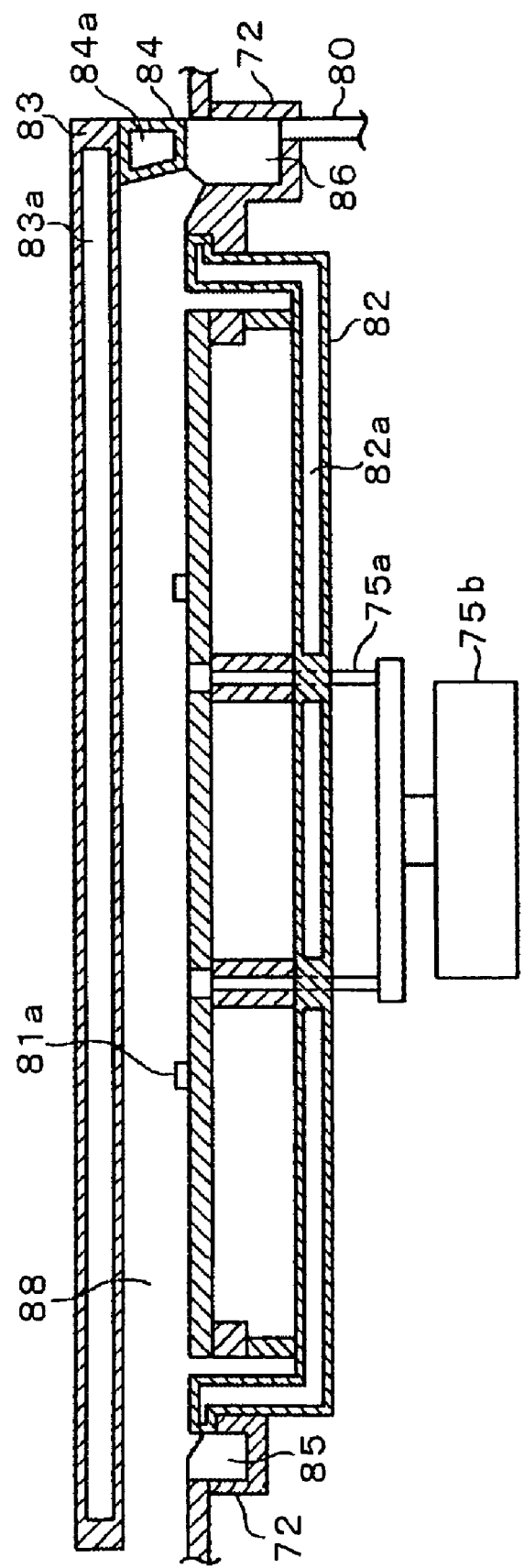
FIG. 14 is a vertical cross-sectional view showing the detailed structure of a hot plate, a top plate and relevant component parts of the heating apparatus of FIG. 12.

In FIGS. 12 to 14, reference numerals 70, 71, 72 and 73 denote a casing, a wafer delivery port, a base plate and an opening formed in the base plate, respectively. Reference numeral 74 denotes a cooling mechanism, which has the same structure as that of the cooling mechanism 3 in the foregoing embodiment and includes a cooling plate 75, a connecting bracket 76, a fin structure 77 with plural cooling fins, and heat pipes (not shown), which move in a front-and-back direction along a guide rail (not shown) by means of a driving mechanism 78. The not shown heat pipes may be embedded in the cooling plate 75 and the connecting bracket 76 in the same manner as that of the heat pipes 38 of the cooling mechanism 3 in the foregoing embodiment. A local suction duct 79 (i.e., a first suction passage) is arranged below the base plate 72. The suction port of the local suction duct 79 is arranged so that it locates adjacent to the fin structure 77 when the cooling plate 75 of the cooling mechanism 74 is positioned in its home position where the cooling plate 75 receives a wafer W from an external wafer conveyer, as the local suction duct 24 of the heating apparatus 2 in the foregoing embodiment is arranged. The distal end of the local suction duct 79 is connected to a suction pipe 80 (i.e., a second suction passage) (described later). Reference numeral 75a denotes support pins for transferring a wafer W between the hot plate 81 and cooling plate 75; and reference numeral 75b denotes a driving mechanism for vertically moving the support pins 75a.

A hot plate 81 of the heating apparatus 7 has essentially the same structure as that of the hot plate 51 in the foregoing embodiment, and the circumference and the bottom of the hot plate 81 is surrounded by a hot-plate support member 82, which has essentially the same structure as that of the hot-plate support member 5 in the foregoing embodiment. Reference numeral 81a denotes projections arranged on the hot plate 81 for supporting the wafer W thereon, and reference numeral 82a denotes vacuum chambers formed in the circumferential wall and the bottom wall of the hot-plate support member 82 and serving as a vacuum insulating layer. Reference numeral 83 denotes a top plate, serving as a gas-flow guide, fixedly arranged above the hot plate 81 via a support 84 to oppose a wafer W placed on the hot plate 81. The top plate 83 is internally provided with a vacuum chamber 83 serving as a vacuum insulating layer which has an enough size to cover the hot plate 81 as viewed from the above. The support 84 is also internally provided with a vacuum chamber 84a. Thus, the top plate 83 and the support 84 have vacuum-insulating structures.

Figure 15:
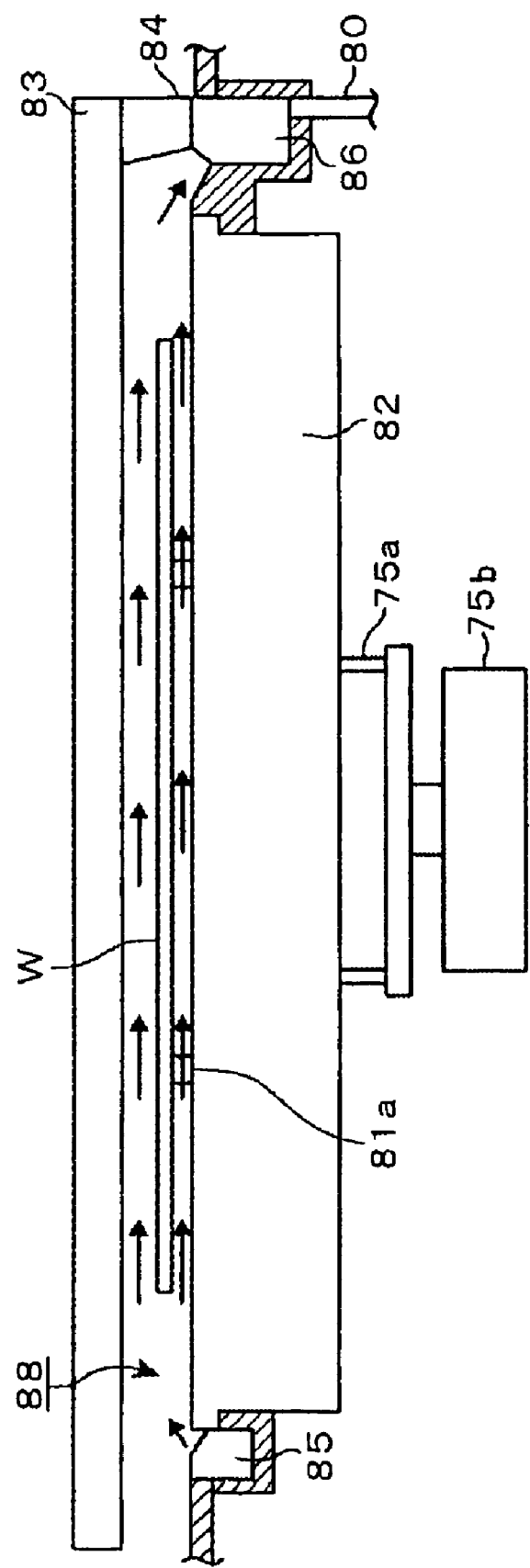
FIG. 15 is an illustration showing gas flow flowing through a space between the hot plate and the top plate of the heating apparatus of FIG. 12.

As shown in FIG. 13 to 15, a gas jetting unit 85 and a gas suctioning unit 86 are disposed such the hot plate 81 is located therebetween. The gas jetting unit 85 and the gas suctioning unit 86 are opposed to each other, and horizontally extend parallel with each other in Y-directions (i.e., the width direction of the casing 70). The gas jetting unit 85 has a plurality of gas jetting holes 85a of a small diameter, which are arrayed in Y-direction. The area in which the gas jetting holes 85a are arranged has a length equal to or larger than the size (i.e., diameter) of the wafer W measured in Y-direction. The gas suctioning unit 86 has a plurality of gas suction holes 85a of a small diameter arrayed in Y-direction. One end of a suction pipe 80 is connected the gas suctioning unit 86. The other end of the suction pipe 80 drawn out of the casing 70, and is connected to a factory exhaust line of a factory exhaust system. A fan 87, or a sucking-force generating device, is arranged in the suction pipe 80 and rotates at a predetermined rotation speed to discharge a gas in the casing 70 through the gas suction holes 86a and the suction port of the local suction duct 79. When the wafer W placed on the projections 81a of the hot plate 81 is heated by the hot plate 81, the gas jetting holes 85a jet a purging gas toward the lower surface of the top plate 83, while the purging gas is suctioned from the space between the hot plate 81 and the top plate 83 through the gas suction holes 85a. Thus, the whole surface of the wafer W is covered by a unidirectional flow (indicated by arrows in FIG. 15) of the purging gas, whose width with respect to Y-direction is equal to or greater than that of the wafer W, and which flows from the one side of the wafer W to the other side of the wafer. After the heating of the wafer W is completed, the cooling plate 75 receives the wafer W from the hot plate 81, and returns to its home position, where the fins of the fin structure 77 are cooled by suctioning a gas in the casing 70 through the suctioning port of the local suction duct 79. Thus, the wafer W on the cooling plate 75 is cooled through the heat transfer through the heat pipes.

In this embodiment, as the wafer W is heated while a gas flows from one side of the wafer W to the other side of the wafer W, the gas is not stagnated around the wafer W, and uniform gas-velocity distribution over the wafer surface can be achieved. Accordingly, the solvent vapor and the sublimed substances originated from the resist liquid can be effectively removed from the space above the wafer W, and thus adhesion of particles to the wafer W can be suppressed. In addition, as the temperature difference between temperature in the space between the hot plate 81 and the back surface of the wafer W and temperature in the space between the top plate 83 and the back surface of the wafer W is small, the unidirectional flow around the wafer W is not disturbed, and thus the wafer W can be processed with a high in-plane uniformity. In addition, as the fin structure 77 of the heating apparatus 7 is cooled in the same manner as that of the heating apparatus 2 when the cooling plate 75 is in its home position, the cooling plate 75 can be also cooled effectively.

It should be noted that the gas jetting holes 85a are not absolutely necessary for generating the unidirectional flow. In one modification, the space 88 between the hot plate 81 and the top plate 83 may be surrounded by a wall having an opening on the cooling plate (73) side, thereby forming a semi-closed cavity in which the wafer W is accommodated. In this case, a unidirectional flow can be generated in the cavity by suctioning the same through the gas suctioning holes 86a, without jetting a gas from the gas jetting holes 85a.

An embodiment of a resist pattern forming system, or a coating and developing system, employing the heating apparatus 2 will be described with reference to FIGS. 16 to 19. The resist pattern forming system includes a carrier block S1, a processing block S2, an interface block 53 and an exposing apparatus S4. A carrier 90 that accommodates therein a plurality of, e.g., thirteen wafers W in an air-tight fashion is loaded into the carrier block S1 and unloaded therefrom. The processing block S2 has a multi-layered construction, in other words, the processing block S2 is constituted by vertically arranging a plurality of, e.g., five sub-blocks B1 to B5.

The carrier block S1 includes a mounting table 91 for mounting thereon the plurality of carriers 90, a gate 92 formed in a front wall surface which is opposed to the mounting table 91, and a transfer arm C for taking the wafer W out of the carrier 90 through the gate 92.

Figure 17:
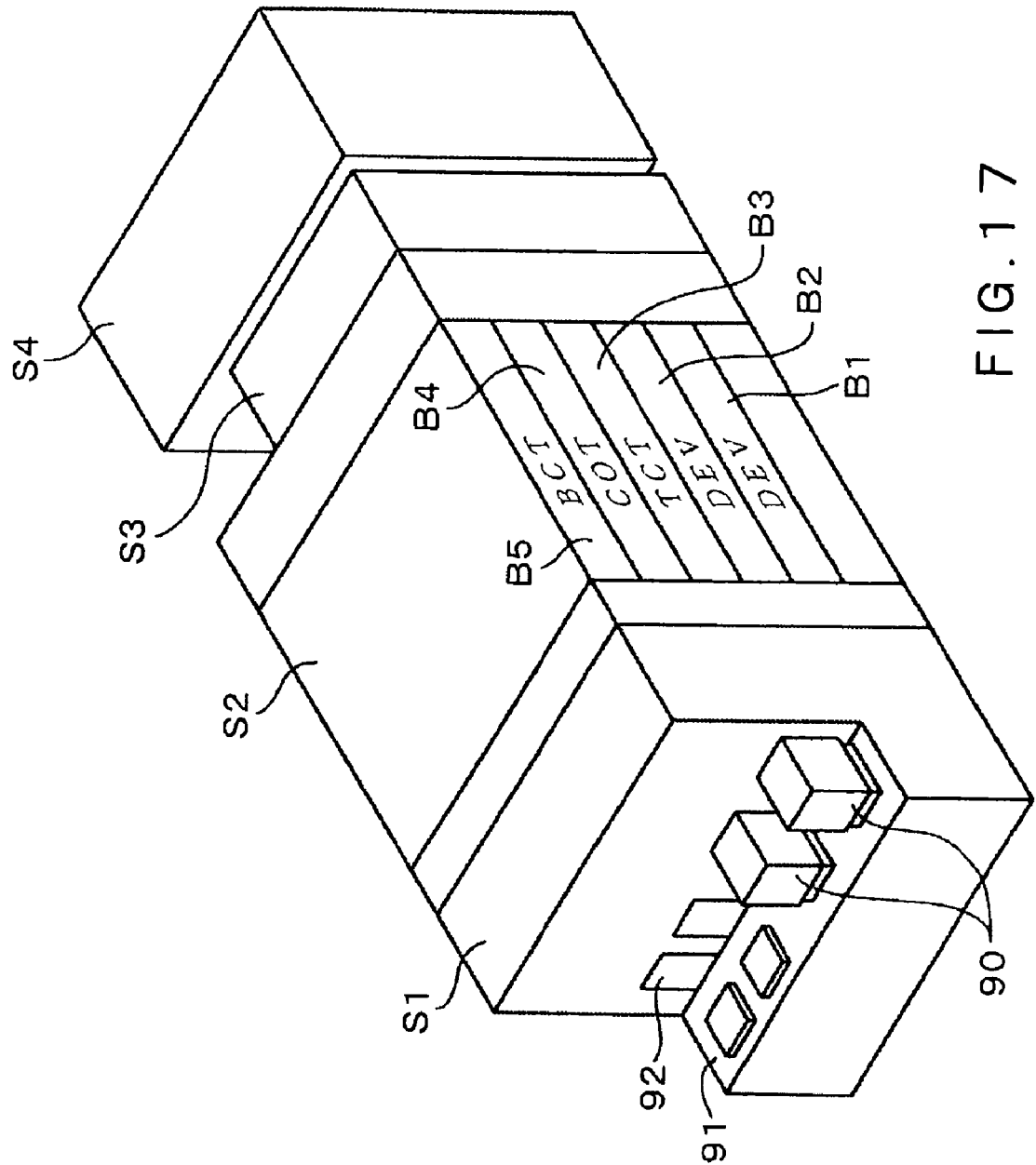
FIG. 17 is a perspective view of the coating and developing system of FIG. 16.

The processing block S2 surrounded by a housing 93 is connected to the backside of the carrier block S1. In the illustrated embodiment, the processing block S2 includes the first to fifth sub-blocks B1 to B5, as shown in FIG. 17. The lowermost and next to the lowermost sub-blocks are the first and the second sub-blocks (DEV layers) B1 and B2 for developing a wafer W. The third sub-block (TCT layer) B3 is provided for forming an anti-reflection film overlying the resist film. The fourth sub-block (COT layer) B4 is provided for coating the wafer W with a resist solution. The fifth sub-block (BCT layer) B5 is provided for forming an anti-reflection film underlying the resist film.

The sub-blocks B1 to B5 are respectively provided with liquid processing units for coating the wafer W with a chemical liquid, various heating and cooling units for processing the wafer W before or after the wafer W is processed by the liquid processing unit, and main arms A1 to A5 that transfers the wafer W among the above units.

The sub-blocks B1 to B5 will be described, taking the COT layer B4 shown in FIG. 14 as an example. As viewed from the carrier block S1, the COT layer B4 is provided with a coating unit 94 on the right side, and four unit-stacks U1 to U4 arrayed in that order on the left side (see FIG. 14). The coating unit 94 includes a plurality of coating devices for coating the wafer W with a resist solution. Each of the unit-stacks U1 to U4 includes stacked heating or cooling units. In the illustrated embodiment, each of the unit-stacks U1 to U4 has two units, for carrying out a pre-treatment before a coating process by the coating unit 94 and/or for carrying out an after-treatment after the coating process by the coating unit 94.

The aforementioned units for carrying out the pre-treatment and the after-treatment of the wafer W include a cooling unit (COL) for adjusting the temperature of the wafer W before the wafer W is coated with the resist solution, a heating unit (CHP) 95 called "pre-baking unit" for heating the wafer W after the wafer W is coated with the resist solution, and a peripheral exposing unit (WEE) for exposing only an edge part of the wafer W. In this coating and developing system, the heating apparatus 2 (7) having been described with reference to FIGS. 1 to 16 is used as the heating unit 95. These plural processing units such as the cooling unit (COL) and the heating unit (CHP) 95 are housed in individual casings 96 (processing vessels). Each of the unit-stacks U1 to U4 is constituted by stacking two of the casings 96. Each of the casings 96 has a transfer port 97 formed in a surface facing a transfer area R1. The wafer W is loaded into and unloaded from the casing 96 through the transfer port 97. In the illustrated embodiment, two of the heating units (CHP) 95 are stacked to form the unit-stack U3, and one of the heating units (CHP) 95 is included in the unit-stack U4 (see FIG. 19).

Figure 19:
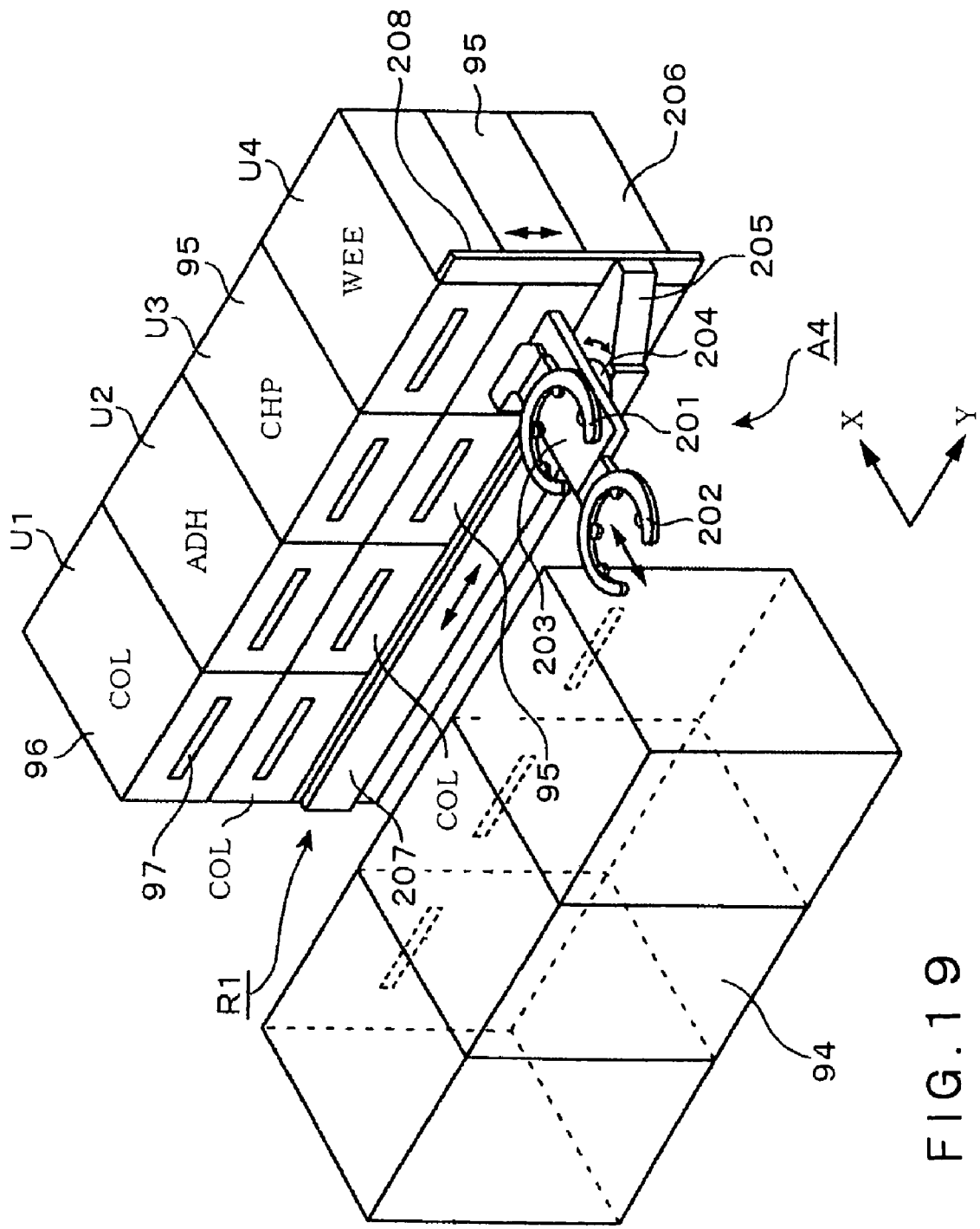
FIG. 19 is a perspective view of coating units and unit-stacks, and a wafer conveyer installed in the coating and developing system of FIG. 16.
Figure 20:
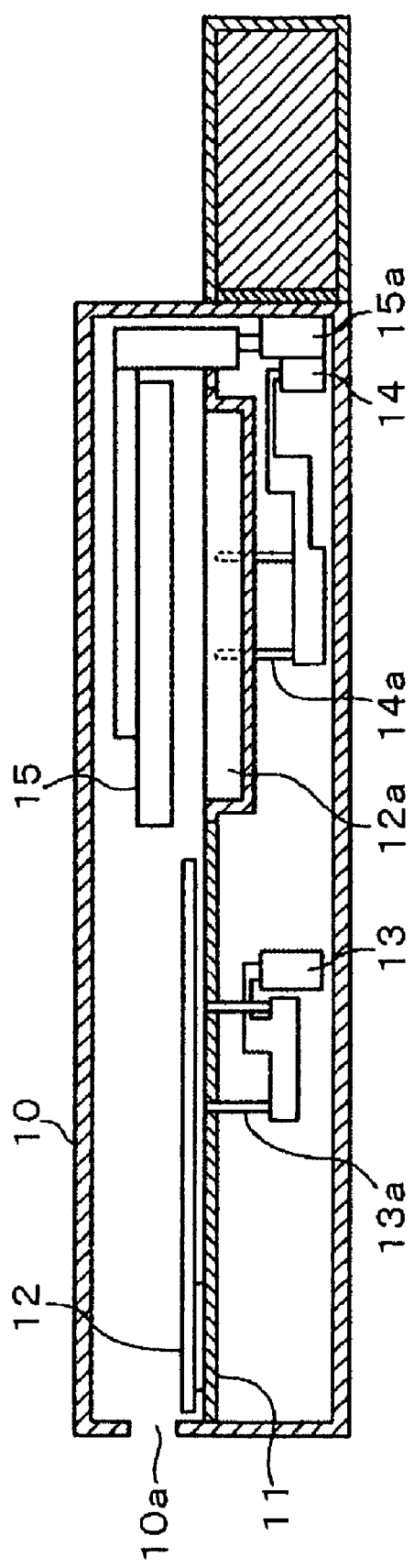
FIG. 20 is a vertical cross-sectional view of a conventional heating apparatus.
Figure 21:
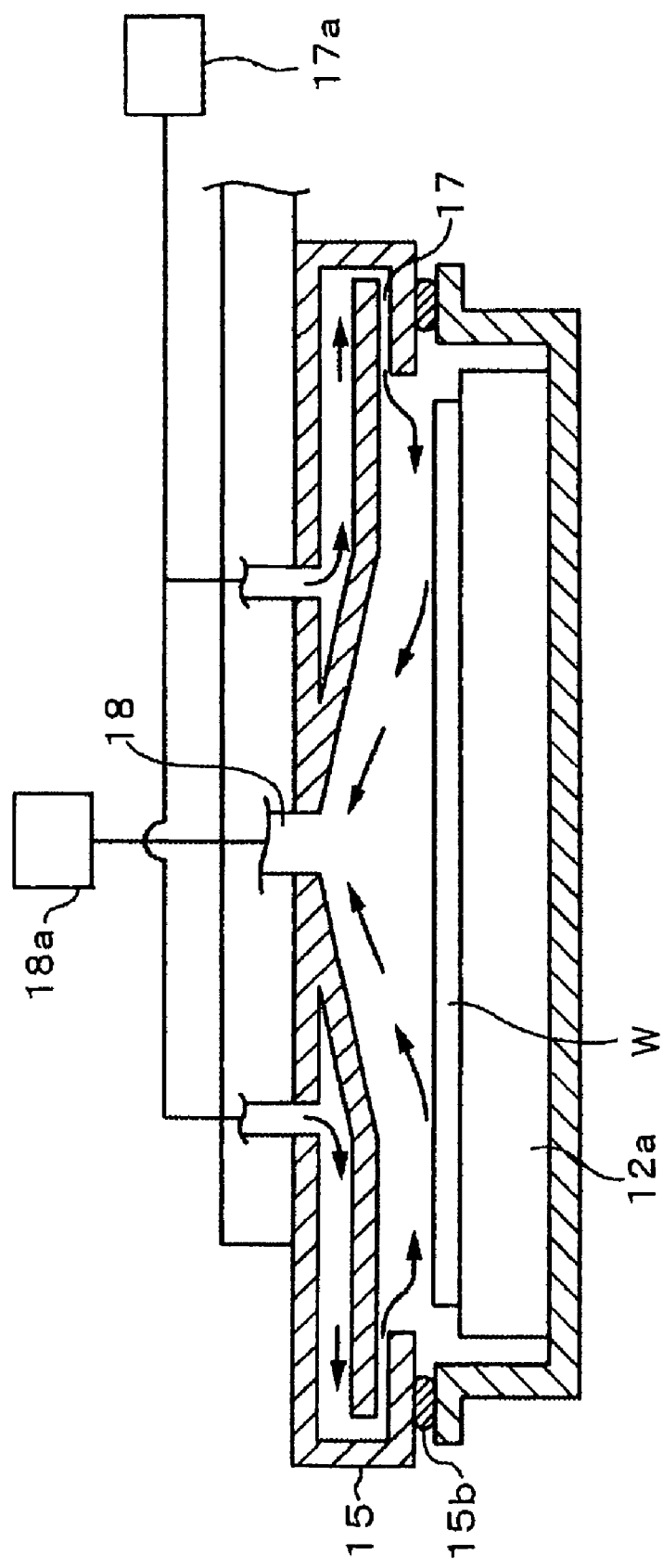
FIG. 21 is a vertical cross-sectional view of a top plate of the conventional heating apparatus of FIG. 20.

The main arm A4 is disposed in the conveying area R1. The main arm A4 is capable of moving forward and backward (X-direction), moving in vertical directions, rotating about a vertical axis, and moving in Y-direction. The main arm A4 includes: two carrying arms 201 and 202 which are independently operated; an arm base 203 to which the carrying arms 201 and 202 are mounted; a rotating mechanism 204 that rotates the arm base 203; and a slidable base 205 supporting the arm base 203 via the rotating mechanism 204 and being movable in Y-direction along a Y-axis rail 207 vertically movable along a vertically-extending rail 208. In FIG. 19, reference numeral designates a unit base supporting the unit stacks U1 to U4 thereon.

Figure 16:
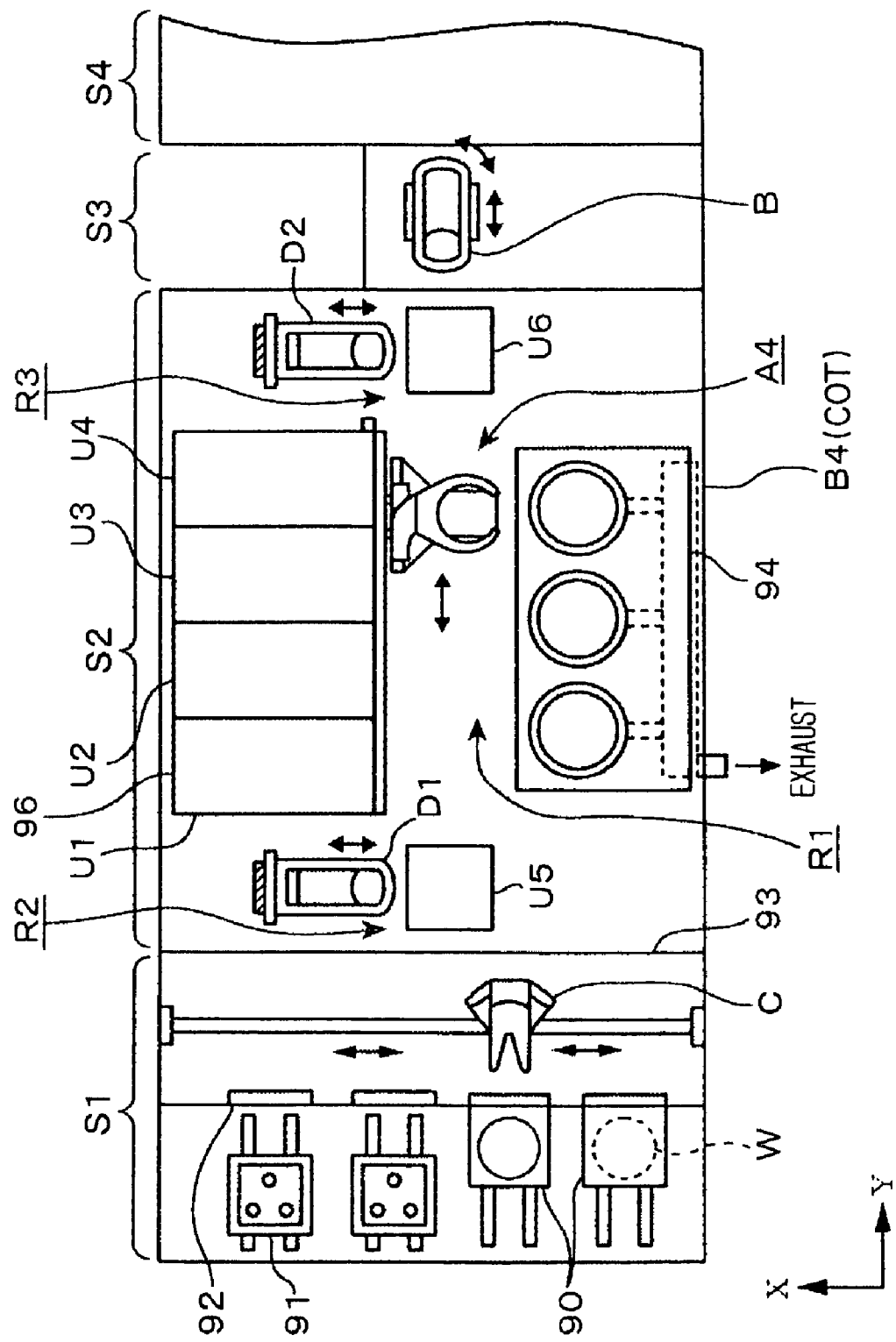
FIG. 16 is a top plan view of a coating and developing system employing the heating apparatus of FIG. 1.
Figure 18:
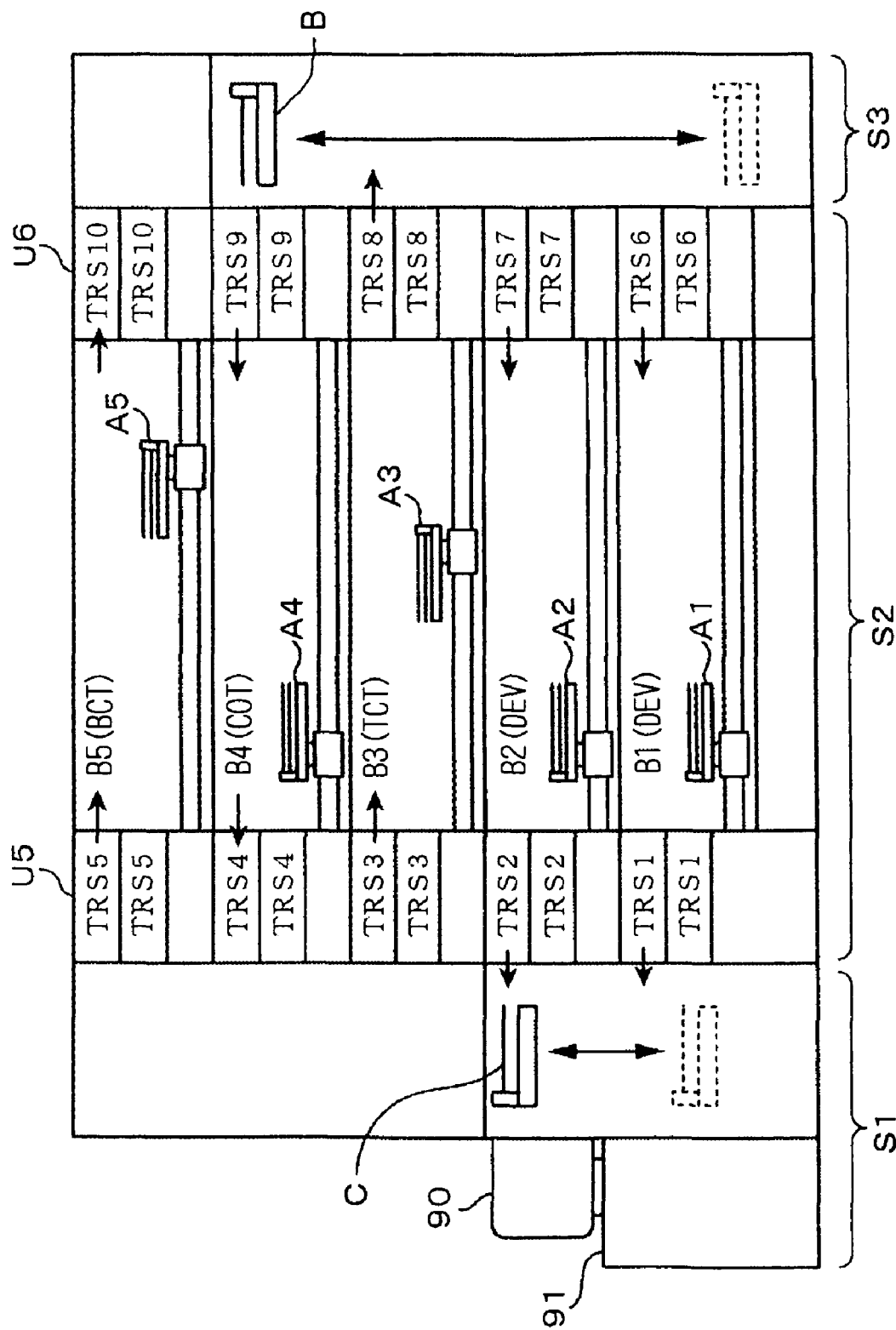
FIG. 18 is a longitudinal, vertical cross-sectional view of the coating and developing system of FIG. 16.

A region of the transfer area R1 adjacent to the carrier block S1 serves as a first wafer transfer area R2. As shown in FIGS. 16 and 18, in the wafer transfer area R2, the unit-stack U5 is arranged at a position where both the transfer arm C and the main arm A4 can access. The first wafer transfer area R2 is provided with a first transfer arm D1 that transfers the wafer W to and from the unit-stack U5.

As shown in FIG. 18, the unit-stack U5 includes a plurality of first transfer stages TRS 1 to TRS 5. More than one (in the illustrated embodiment, two) first transfer stages (TRS 1 to TRS 5) are assigned to each of the sub-blocks (B1 to B5), and can be accessed by the main arm (A1 to A5) assigned to each of the sub-blocks (B1 to B5) to transfer the wafer W.

A region of the conveying area R1 adjacent to the interface block S3 serves as a second wafer transfer area R3. As shown in FIG. 16, in the second transfer area R3, the unit-stack U6 is arranged at a position where the main arm A4 can access. The first wafer transfer area R2 is provided with a second transfer arm D2 that transfers the wafer W to and from the unit-stack U6.

As shown in FIG. 18, the unit-stack U6 includes a plurality of first transfer stages TRS 6 to TRS 10. More than one (in the illustrated embodiment, two) first transfer stages (TRS 6 to TRS 10) are assigned to each of the sub-blocks (B1 to B5), and can be accessed by the main arm (A1 to A5) assigned to each of the sub-blocks (B1 to B5) to transfer the wafer W.

The other sub-blocks (layers) B1 to B3, and B5 and B6 will be briefly described below. The DEV layers B1 and B2 have the same structure, and each includes a developing unit having a plurality of developing devices for developing the wafer W. Each of the unit-stacks U1 to U4 of the DEV layers B1 and B2 includes a heating unit (PEB) called "post-exposure baking unit" for heating the exposed wafer W, a cooling unit (COL) for adjusting the temperature of the wafer W after the wafer W is processed by the heating unit (PEB), and a heating unit (POST) called "post-baking unit" for heating the developed wafer W to remove moisture therefrom. Apart from what mentioned above, each of the DEV layers B1 and B2 has the same structure as that of the COT layer B4. The heating units arranged in the DEV layers B1 and B2 have the same structure as that of the heating unit 95 of the COT layer B4, but the former is different from the latter only in the process temperature and the process time period.

The TCB layer B3 includes an antireflection-film forming unit that coats the wafer W with a chemical liquid for forming an anti-reflection film before the wafer W is coated with the resist solution.

An exposing apparatus S4 is connected to the processing block S2 on the back side of the unit-stack 6 through the interface block S3. The interface block S3 is provided with an interface arm B for transferring the wafer W to and from the second transfer stages TRS6 to TRS9 of the first to fourth sub-blocks B1 to B4.

The flow of the wafer W in the resist pattern forming apparatus will be describe below, where the anti-reflection films are formed on both upper and lower surfaces of a resist film. A carrier 90 is loaded into the carrier block S1 from outside. A wafer W is taken out from the carrier 90 by the transfer arm C. The wafer W is transferred from the transfer arm C to the transfer stage TRS2 of the unit-stack U5 assigned to the second sub-block B2. The first transfer arm D1 transfers the wafer W from the transfer stage TRS2 to the transfer stage TRS5 assigned to the BCT layer B5, and then the main arm A5 of the BCT layer B5 receives the wafer W. Thereafter, in the BCT layer B5, the wafer W is transferred by the main arm A5 to the cooling unit (COL), the first anti-reflection film forming unit, the heating unit (CHP), and the second transfer stage TRS10 of the unit-stack U6, in that order. Thus, a first anti-reflection film is formed on the wafer W.

Subsequently, the wafer W on the transfer stage TRS10 assigned to the BCT layer B5 is transferred by the second transfer arm D2 to the transfer stage TRS9 assigned to the COT layer B4, and then to the main arm A4 of the COT layer B4. In the COT layer 4, the wafer W is transferred by the main arm A4 to the cooling unit (COL), the coating unit 94, the heating unit (CHP) 95, and the transfer stage TRS4, in that order. Thus, a resist film is formed on the first anti-reflection film.

Next, the wafer W on the transfer stage TRS4 assigned to the COT layer 4 is transferred by the first transfer arm D1 to the transfer stage TRS3 assigned to the TCT layer B3, and then to the main arm A3 of the TCT layer B3. In the TCT layer B3, the wafer W is transferred by the main arm A3 to the cooling unit (COL), the second anti-reflection film forming unit, the heating unit (CHP), the peripheral exposing unit (WEE), and the second transfer stage TRS8 of the unit-stack U6, in that order. Thus, a second anti-reflection film is formed on the resist film.

Next, the wafer W on the second transfer stage TRS 8 is transferred by the interface arm B to the exposing apparatus S4, where the wafer W is subjected to a predetermined exposure process. After the wafer W is exposed, the exposed wafer W is transferred by the interface arm B to the second transfer stage TRS6 (or TRS7) of the unit-stack U6 assigned to the DEV layer B1 (or DEV layer B2). The wafer W on the stage TRS6 (or TRS7) is picked up by the main arm A1 (or main arm A2) of the DEV layer B1 (or DEV layer B2). In the DEV layer B1 (or DEV layer B2), the wafer W is transferred to the heating unit (PEB), the cooling unit (COL), the developing unit, and the heating unit (POST), in that order. Thus, the wafer W is subjected to a predetermined developing process. The developed wafer W is transferred to the first transfer stage TRS1 (or TRS2) and then to the transfer arm C. Finally, the wafer W is returned by the transfer arm C to the original carrier 90 placed on the carrier block S1.

As previously mentioned, the heating apparatus 2 (7) according to the present invention is small sized, and thus contributes to achievement of a coating and developing system of a small size if incorporated therein.

The heating apparatus 2 is may be applied to an insulating film forming system that coats a substrate with a liquid precursor of an insulating film and heats the liquid precursor to form the insulating film on the substrate, other than the coating and developing system described above.

What is claimed is:

1. A substrate heating apparatus, comprising:
   a casing;
   a hot plate, arranged in the casing, adapted to heat a substrate coated with a coating solution;
   a cooling plate, arranged in the casing, adapted to support the substrate thereon, adapted to move between a first position in the casing in which the substrate is transferred between the cooling plate and an external substrate conveyer arranged outside the casing and a second position in the casing above the hot plate in which the substrate is transferred between the cooling plate and the hot plate, and adapted to cool the substrate having been heated by the hot plate;
   a cooling-plate driving mechanism adapted to move the cooling plate between the first position and the second position;
   a substrate support member adapted to temporarily support the substrate to transfer the substrate between the hot plate and the cooling plate;
   a substrate-support-member drive unit adapted to move the substrate support member;
   a heat pipe having a first end connected to the cooling plate, and a second end;
   a fin structure having cooling fins thermally connected to the second end of the heat pipe, and connected to the cooling plate such that the fin structure moves together with the cooling plate; and
   a first suction passage having a suction port opening into a space in the casing such that the suction port is located adjacent to the fin structure when the cooling plate is in the first position, whereby the cooling plate is cooled through the heat pipe when a gas in the casing is suctioned through the suction port to form a gas flow flowing through a gap between adjacent fins of the fin structure to cool the fin structure.

2. The substrate heating apparatus according to claim 1, wherein:
   the first position of the cooling plate is horizontally removed from the second position of the cooling plate;
   the casing is provided therein with a partitioning plate dividing an interior of the casing into an upper space above the partitioning plate and a lower space below the partitioning plate;
   the cooling plate is arranged in the upper space;
   the cooling-plate driving mechanism and the substrate-support-member drive unit are arranged in the lower space; and
   the first suction passage extends through the lower space.

3. The substrate heating apparatus according to claim 2 further comprising:

a top plate arranged above the hot plate to oppose the hot plate;

a second suction passage having a suction port adapted to suction a gas from a space between the hot plate and the top plate to form a gas flow flowing along the top plate and flowing into the suction port of the second suction passage;

a main suction passage into which the second suction passage merges; and a sucking-force generating device arranged in the main suction passage adapted to generate a sucking force to suction the lower space of the casing, wherein the first suction passage is connected to the main suction passage at a position upstream of the sucking-force generating device.

4. The substrate heating apparatus according to claim 1 further comprising:

a top plate arranged above the hot plate to oppose the hot plate; and a second suction passage having a suction port adapted to suction a gas from a space between the hot plate and the top plate to form a gas flow flowing along the top plate and flowing into the suction port of the second suction passage;

wherein the second suction passage merges into the first suction passage.

5. The substrate heating apparatus according to claim 1, wherein the cooling plate has cut-outs at a periphery thereof, whereby the external substrate conveyer having a substrate-carrying arm, whose profile corresponds to that of the cut-outs, holding the substrate can vertically pass through the cooling plate to transfer the substrate to the cooling plate.

6. A coating and developing system, comprising:

a carrier block adapted to receive or deliver a substrate carrier holding substrates;

a processing block including a coating apparatus adapted to apply a resist onto a substrate removed from a carrier, the substrate heating apparatus as defined in claim 1 adapted to heat the substrate coated with the resist, and a developing apparatus adapted to develop the substrate having been exposed; and an interface block adapted to transfer the substrate between the processing block and an exposing apparatus.

* * * * *